United States Patent
Yu

(10) Patent No.: US 12,044,908 B2
(45) Date of Patent: Jul. 23, 2024

(54) III-V/SI HYBRID OPTOELECTRONIC DEVICE AND METHOD OF MANUFACTURE

(71) Applicant: ROCKLEY PHOTONICS LIMITED, Altrincham (GB)

(72) Inventor: Guomin Yu, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 693 days.

(21) Appl. No.: 17/055,541

(22) PCT Filed: May 15, 2019

(86) PCT No.: PCT/IB2019/000565
§ 371 (c)(1),
(2) Date: Nov. 13, 2020

(87) PCT Pub. No.: WO2019/220207
PCT Pub. Date: Nov. 21, 2019

(65) Prior Publication Data
US 2021/0111301 A1 Apr. 15, 2021

Related U.S. Application Data

(60) Provisional application No. 62/672,465, filed on May 16, 2018.

(51) Int. Cl.
*G02F 1/025* (2006.01)
*H01L 33/00* (2010.01)
(Continued)

(52) U.S. Cl.
CPC .......... *G02F 1/025* (2013.01); *H01L 33/0066* (2013.01); *H01L 33/30* (2013.01);
(Continued)

(58) Field of Classification Search
CPC ...................................... G02F 1/025
See application file for complete search history.

(56) References Cited

U.S. PATENT DOCUMENTS

| 5,163,118 A | 11/1992 | Lorenzo et al. |
| 6,154,475 A | 11/2000 | Soref et al. |

(Continued)

FOREIGN PATENT DOCUMENTS

| CN | 102162137 A | 8/2011 |
| CN | 105612612 A | 5/2016 |

(Continued)

OTHER PUBLICATIONS

International Search Report issued in PCT/IB2019/000565, Sep. 17, 2019, 4 pages.

(Continued)

*Primary Examiner* — Peter M Albrecht
(74) *Attorney, Agent, or Firm* — Lewis Roca Rothgerber Christie LLP

(57) ABSTRACT

A method of manufacturing an electro-optically active device. The method comprising the steps of: etching a cavity on a silicon-on-insulator wafer; providing a sacrificial layer adjacent to a substrate of a lll-V semiconductor wafer; epitaxially growing an electro-optically active structure on the lll-V semiconductor wafer; etching the epitaxially grown optically active structure into an electro-optically active mesa; disposing the electro-optically active mesa in the cavity of the silicon-on-insulator wafer and bonding a surface of the electro-optically active mesa, which is distal to the sacrificial layer, to a bed of the cavity; and removing the sacrificial layer between the substrate of the lll-V semiconductor wafer and the electro-optically active mesa.

20 Claims, 33 Drawing Sheets

(51) Int. Cl.
  *H01L 33/30*  (2010.01)
  *H01L 33/58*  (2010.01)
  *G02B 6/12*   (2006.01)

(52) U.S. Cl.
  CPC .... *H01L 33/58* (2013.01); *G02B 2006/12061* (2013.01); *G02B 2006/12085* (2013.01); *G02B 2006/12142* (2013.01)

(56) References Cited

U.S. PATENT DOCUMENTS

| | | |
|---|---|---|
| 6,222,951 B1 | 4/2001 | Huang |
| 7,257,283 B1 | 8/2007 | Liu et al. |
| 7,391,801 B1 | 6/2008 | Soref et al. |
| 8,106,379 B2 | 1/2012 | Bowers |
| 8,160,404 B2 | 4/2012 | Pan et al. |
| 8,330,242 B2 | 12/2012 | Shiba et al. |
| 8,710,470 B2 | 4/2014 | Gattass et al. |
| 8,767,792 B2 | 7/2014 | Bowers et al. |
| 8,768,132 B2 | 7/2014 | Stewart et al. |
| 9,134,553 B2 | 9/2015 | Lim et al. |
| 9,209,142 B1 | 12/2015 | Lambert et al. |
| 9,368,579 B2 | 6/2016 | Balram et al. |
| 9,500,807 B2 | 11/2016 | Oka |
| 9,513,498 B2 | 12/2016 | Jones et al. |
| 9,768,195 B2 | 9/2017 | Chou et al. |
| 9,922,967 B2 | 3/2018 | Krasulick |
| 10,340,661 B2 | 7/2019 | Caër et al. |
| 2002/0172464 A1 | 11/2002 | Delwala |
| 2003/0003734 A1 | 1/2003 | Delwala |
| 2003/0003735 A1 | 1/2003 | Deliwala |
| 2003/0003736 A1 | 1/2003 | Delwala |
| 2003/0003737 A1 | 1/2003 | Delwala |
| 2003/0003738 A1 | 1/2003 | Delwala |
| 2004/0069984 A1 | 4/2004 | Estes et al. |
| 2004/0207016 A1 | 10/2004 | Patel et al. |
| 2004/0258347 A1 | 12/2004 | Gothoskar et al. |
| 2005/0189591 A1 | 9/2005 | Gothoskar et al. |
| 2005/0236619 A1 | 10/2005 | Patel et al. |
| 2006/0177173 A1 | 8/2006 | Shastri et al. |
| 2008/0073744 A1 | 3/2008 | Masini et al. |
| 2008/0267239 A1 | 10/2008 | Hall et al. |
| 2009/0016666 A1 | 1/2009 | Kuo et al. |
| 2009/0324164 A1 | 12/2009 | Reshotko et al. |
| 2010/0247021 A1 | 9/2010 | Cunningham et al. |
| 2010/0247022 A1 | 9/2010 | Li et al. |
| 2010/0247029 A1 | 9/2010 | Li et al. |
| 2010/0330727 A1 | 12/2010 | Hill et al. |
| 2011/0012221 A1 | 1/2011 | Fujikata et al. |
| 2011/0170819 A1 | 7/2011 | Zheng et al. |
| 2011/0215344 A1 | 9/2011 | Dardy et al. |
| 2011/0299561 A1 | 12/2011 | Akiyama |
| 2012/0207424 A1 | 8/2012 | Zheng et al. |
| 2012/0207479 A1 | 8/2012 | Krishnamoorthy et al. |
| 2012/0219250 A1 | 8/2012 | Ren et al. |
| 2012/0300796 A1 | 11/2012 | Sysak et al. |
| 2013/0039664 A1 | 2/2013 | Clifton et al. |
| 2013/0051727 A1 | 2/2013 | Mizrahi et al. |
| 2013/0195137 A1 | 8/2013 | Bowers et al. |
| 2013/0279845 A1 | 10/2013 | Kobrinsky et al. |
| 2013/0285184 A1 | 10/2013 | Li |
| 2013/0321816 A1 | 12/2013 | Dattner et al. |
| 2014/0061677 A1 | 3/2014 | Jakoby et al. |
| 2014/0270618 A1 | 9/2014 | Dinu et al. |
| 2014/0307997 A1 | 10/2014 | Bar et al. |
| 2014/0334768 A1 | 11/2014 | Chang et al. |
| 2014/0338726 A1* | 11/2014 | Nobori ............... H01L 31/024 136/246 |
| 2015/0097210 A1 | 4/2015 | Krasulick et al. |
| 2015/0098676 A1 | 4/2015 | Krasulick et al. |
| 2015/0125111 A1 | 5/2015 | Orcutt et al. |
| 2015/0270684 A1 | 9/2015 | Suzuki et al. |
| 2016/0043262 A1 | 2/2016 | Okumura |
| 2016/0087160 A1 | 3/2016 | Cheng et al. |
| 2016/0109731 A1 | 4/2016 | Huang |
| 2016/0111407 A1 | 4/2016 | Krasulick |
| 2016/0211645 A1 | 7/2016 | Padullaparthi |
| 2016/0246016 A1 | 8/2016 | Mizrahi et al. |
| 2016/0358954 A1 | 12/2016 | Hoyos et al. |
| 2017/0207600 A1 | 7/2017 | Klamkin et al. |
| 2017/0229840 A1 | 8/2017 | Lambert |
| 2017/0255077 A1 | 9/2017 | Pruessner et al. |
| 2017/0317471 A1 | 11/2017 | Lor et al. |
| 2018/0019139 A1 | 1/2018 | Sun et al. |
| 2018/0081118 A1 | 3/2018 | Klamkin et al. |
| 2018/0246351 A1 | 8/2018 | Ho et al. |
| 2019/0140425 A1 | 5/2019 | Hahn et al. |
| 2019/0179177 A1 | 6/2019 | Rickman et al. |
| 2019/0377203 A1 | 12/2019 | Yu et al. |
| 2019/0384003 A1 | 12/2019 | Painchaud et al. |
| 2019/0384073 A1 | 12/2019 | Yu et al. |
| 2020/0124878 A1 | 4/2020 | Yu et al. |
| 2020/0363662 A1 | 11/2020 | Yu et al. |

FOREIGN PATENT DOCUMENTS

| | | |
|---|---|---|
| GB | 2573586 A | 11/2019 |
| JP | 2005-300678 A | 10/2005 |
| JP | 2012151327 A * | 8/2012 |
| JP | 2014525608 A | 9/2014 |
| JP | 2016533027 A | 10/2016 |
| WO | 2009110632 A1 | 9/2009 |
| WO | WO 2018/096038 A1 | 5/2018 |

OTHER PUBLICATIONS

Written Opinion of the International Searching Authority issued in PCT/IB2019/000565, Sep. 17, 2019, 9 pages.
Japanese Notification of Reasons for Refusal, for Patent Application No. 2020-528381, mailed Feb. 22, 2022, 5 pages.
Partial English translation of the Japanese Notification of Reasons for Refusal, for Patent Application No. 2020-528381, mailed Feb. 22, 2022, 5 pages.
Claussen, S.A. et al., "Selective area growth of germanium and germanium/silicon-germanium quantum wells in silicon waveguides for on-chip optical interconnect applications", Optical Materials Express, Oct. 1, 2012, pp. 1336-1342, vol. 2, No. 10, OSA.
International Search Report and Written Opinion of the International Searching Authority, Mailed Mar. 8, 2018, Corresponding to PCT/EP2017/080221, 13 pages.
International Search Report and Written Opinion of the International Searching Authority, Mailed Aug. 29, 2018, Corresponding to PCT/EP2018/062269, 15 pages.
Ren, S., "Ge/SiGe Quantum Well Waveguide Modulator for Optical Interconnect Systems", Dissertation submitted to the department of electrical engineering and the committee on graduate studies of Stanford University in partial fulfillment of the requirements for the degree of doctor of philosophy, Mar. 2011, 138 pages.
Ren, S. et al., "Selective epitaxial growth of Ge/Si$_{0.15}$Ge$_{0.85}$ quantum wells on Si substrate using reduced pressure chemical vapor deposition", Applied Physics Letters, 2011, pp. 151108-1 through 151108-3, American Institute of Physics.
Rouifed, Mohamed-Saïd et al., "Advances Toward Ge/SiGe Quantum-Well Waveguide Modulators at 1.3μm", IEEE Journal of Selected Topics in Quantum Electronics, 2013, 7 pages, vol. 20, No. 4, IEEE.
U.K. Intellectual Property Office Combined Search and Examination Report, Dated Sep. 27, 2018, for Patent Application No. GB1812309.1, 5 pages.
U.K. Intellectual Property Office Combined Search and Examination Report, Dated Sep. 27, 2018 and re-sent by Examiner Sep. 26, 2019, for Patent Application No. GB1812309.1, 7 pages.
U.K. Intellectual Property Office Combined Search and Examination Report, dated Feb. 17, 2020, for Patent Application No. GB1912499.9, 5 pages.
U.S. Notice of Allowance for U.S. Appl. No. 16/463,203, dated Aug. 31, 2020, 8 pages.
U.S. Office Action for U.S. Appl. No. 16/427,247, dated Apr. 15, 2020, 14 pages.

(56) References Cited

OTHER PUBLICATIONS

U.S. Office Action for U.S. Appl. No. 16/463,203, dated Apr. 16, 2020, 13 pages.
U.S. Office Action for U.S. Appl. No. 16/766,268, dated Feb. 2, 2021, 16 pages.
Chinese Notification of the First Office Action, for Patent Application No. 201780038803.8, mailed Aug. 22, 2022, 8 pages.
Partial English translation of the Chinese Notification of the First Office Action, for Patent Application No. 201780038803.8, mailed Aug. 22, 2022, 16 pages.
European Patent Office Communication pursuant to Article 94(3) EPC, dated Jan. 4, 2022, for Patent Application No. GB 18 723 010.7, 5 pages.

* cited by examiner

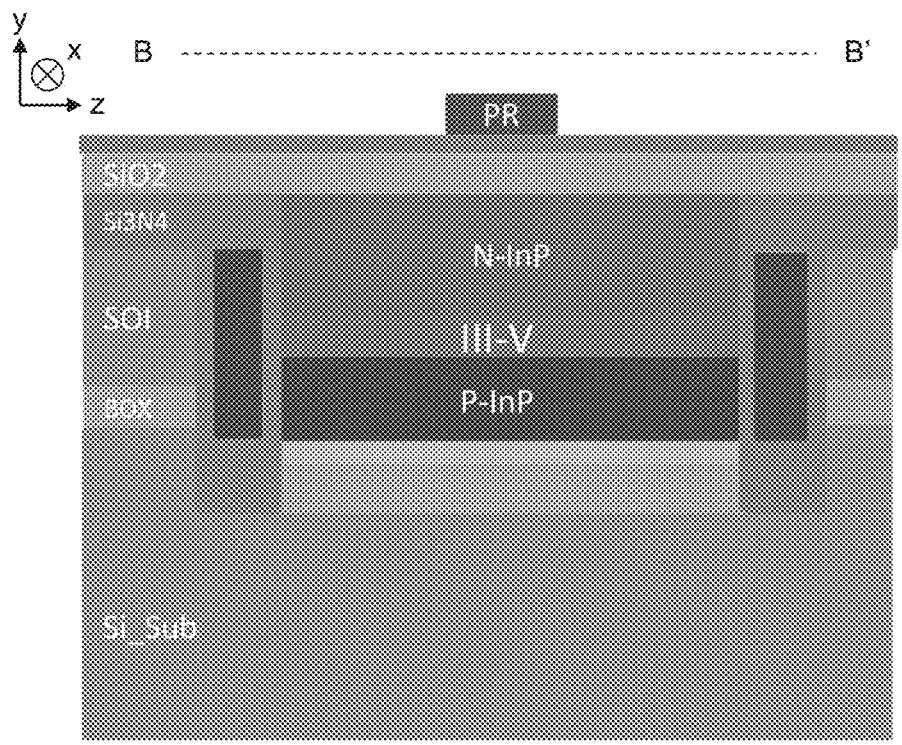
Fig. 3(p)(i)
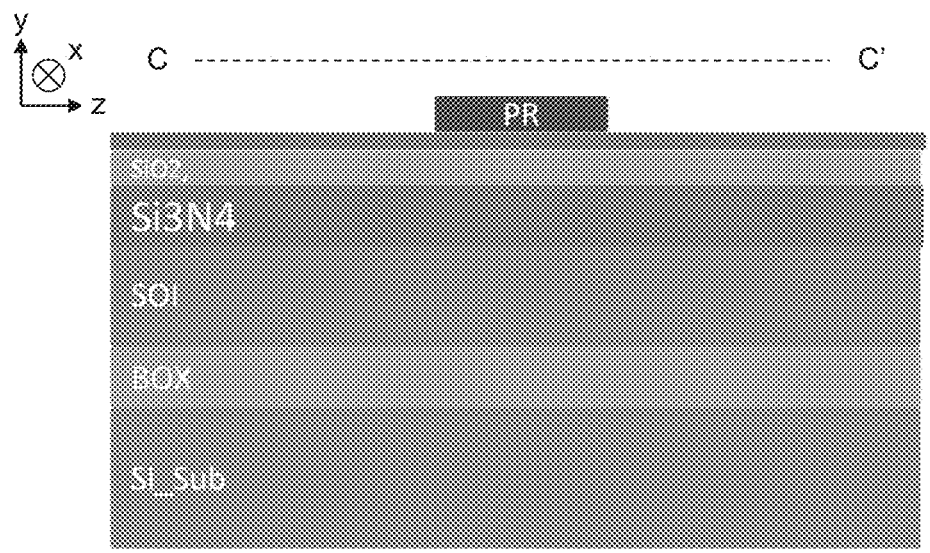
Fig. 3(p)(ii)

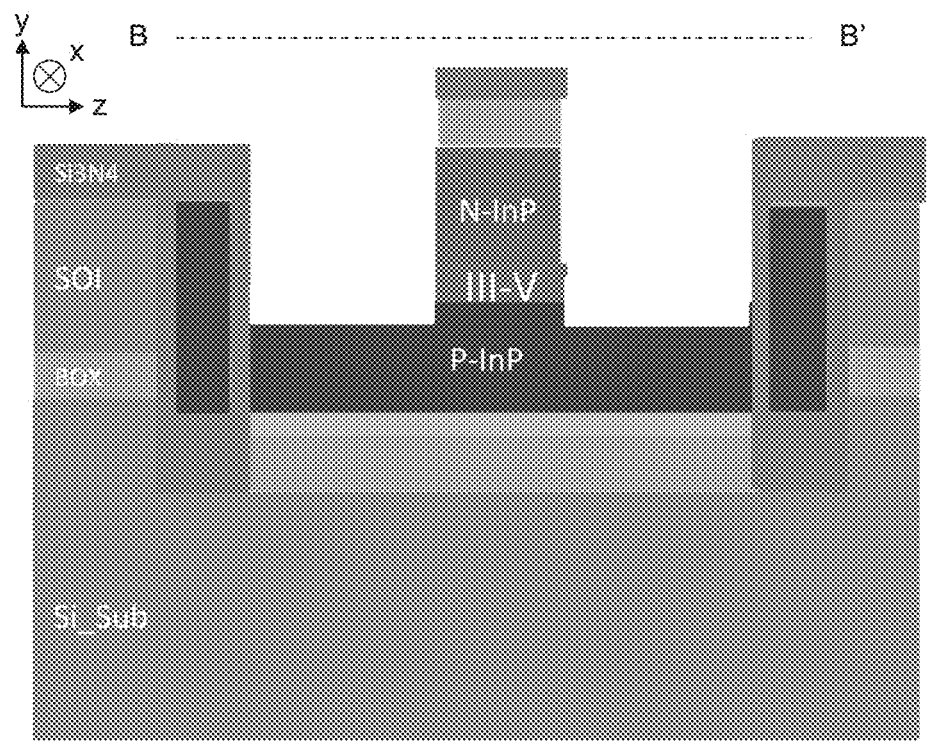
Fig. 3(q)(i)
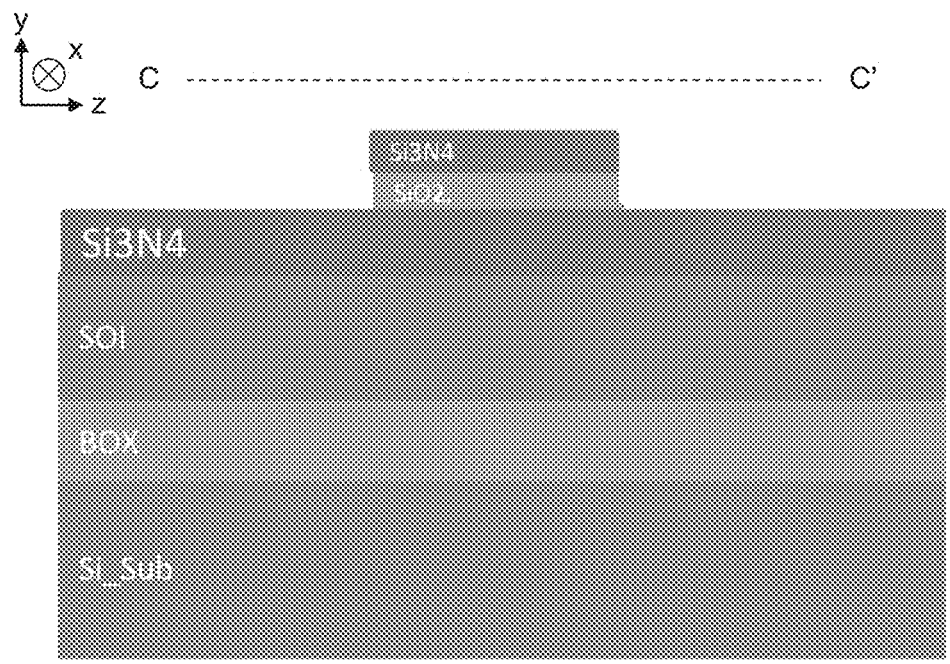
Fig. 3(q)(ii)

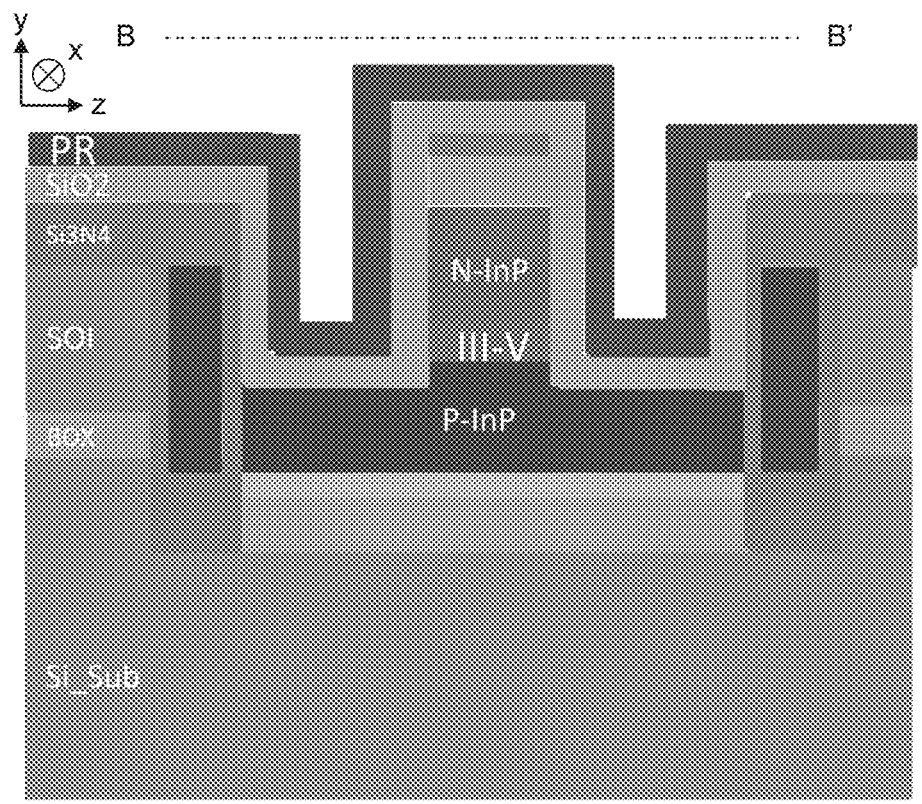
Fig. 3(r)(i)
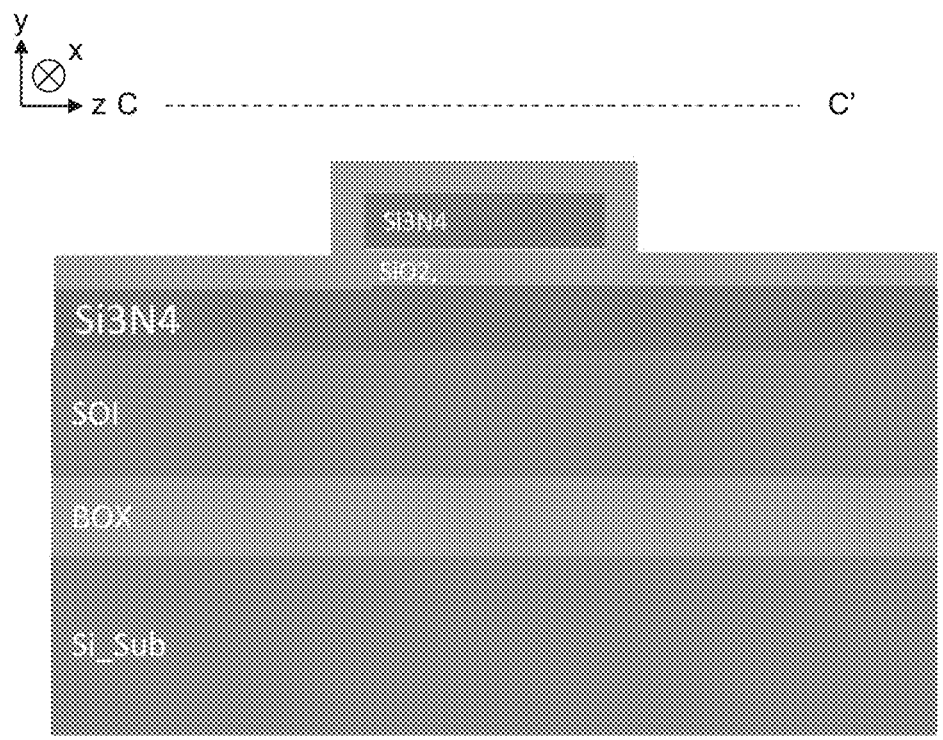
Fig. 3(r)(ii)

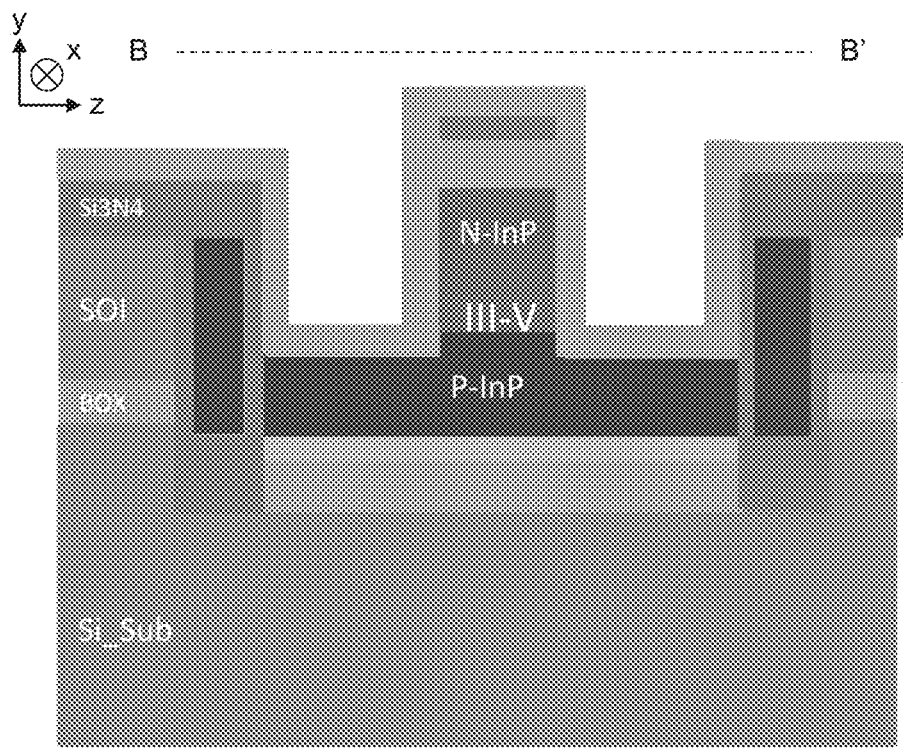
Fig. 3(s)(i)
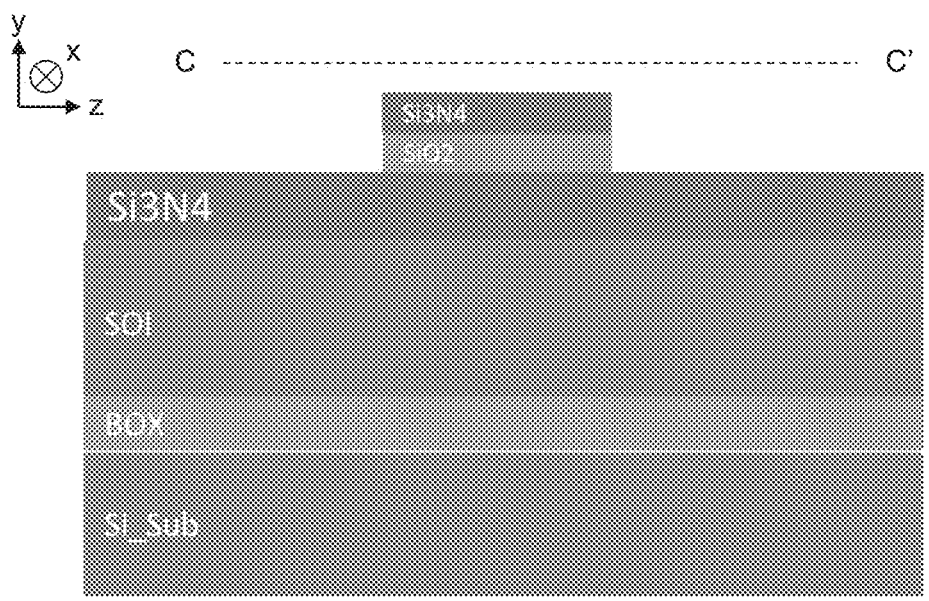
Fig. 3(s)(ii)

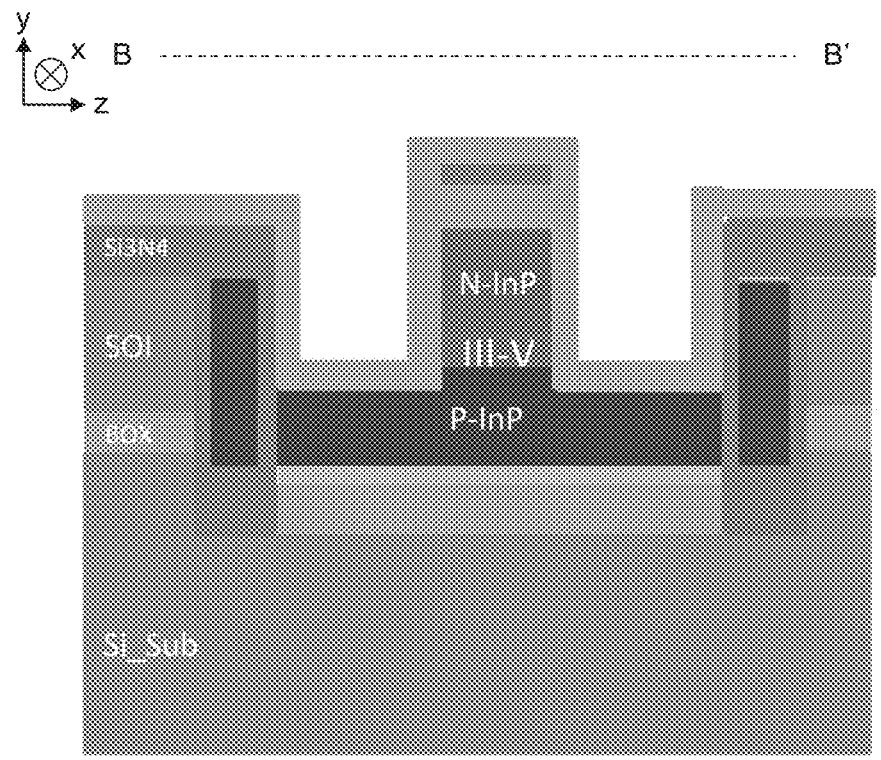
Fig. 3(t)(i)
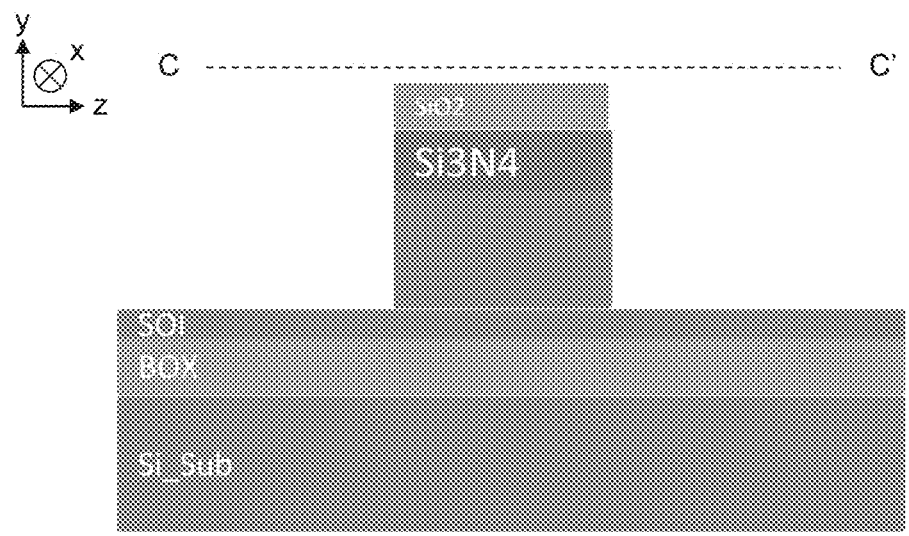
Fig. 3(t)(ii)

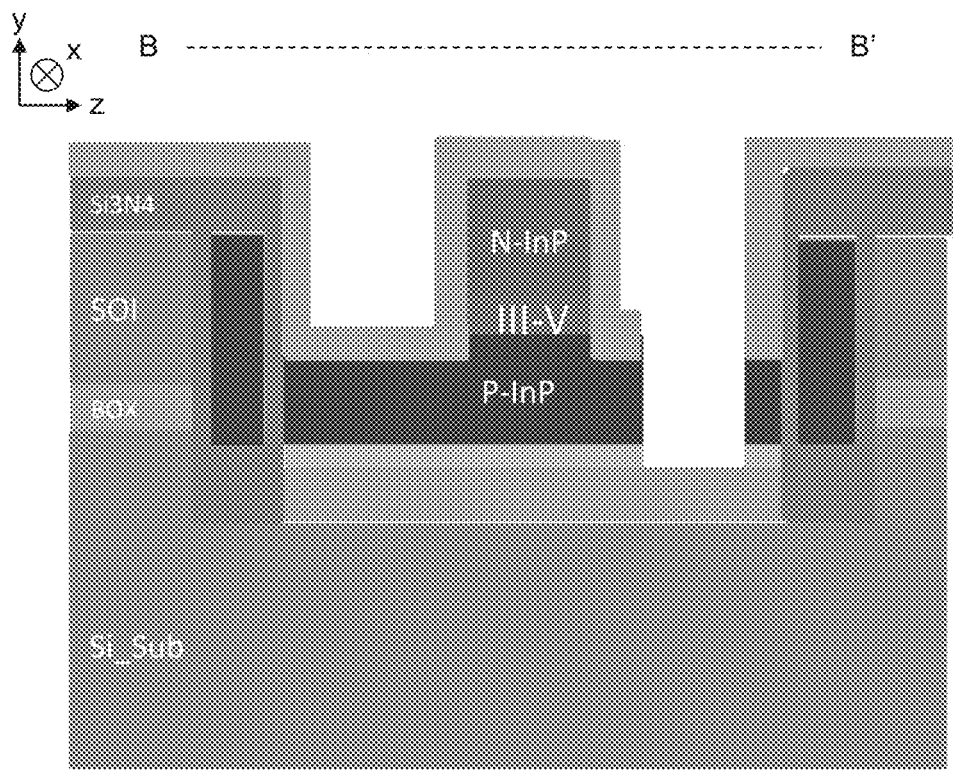
Fig. 3(u)(i)
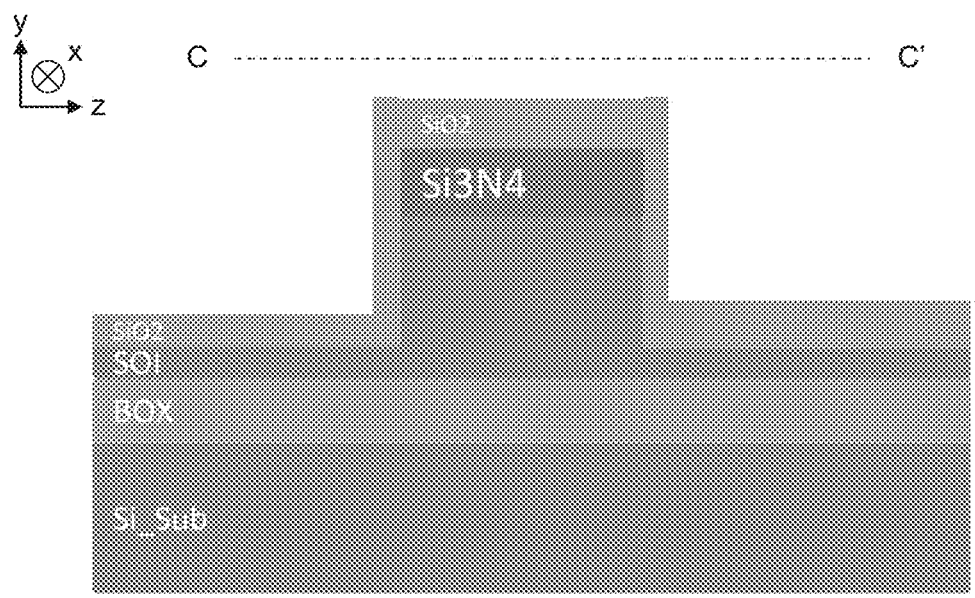
Fig. 3(u)(ii)

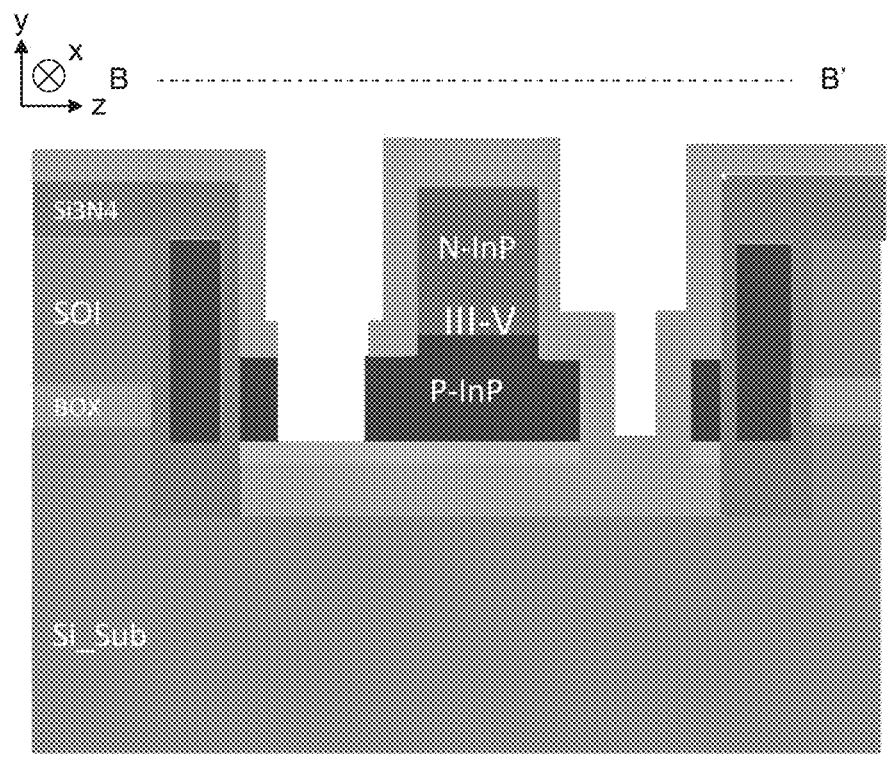
Fig. 3(v)(i)
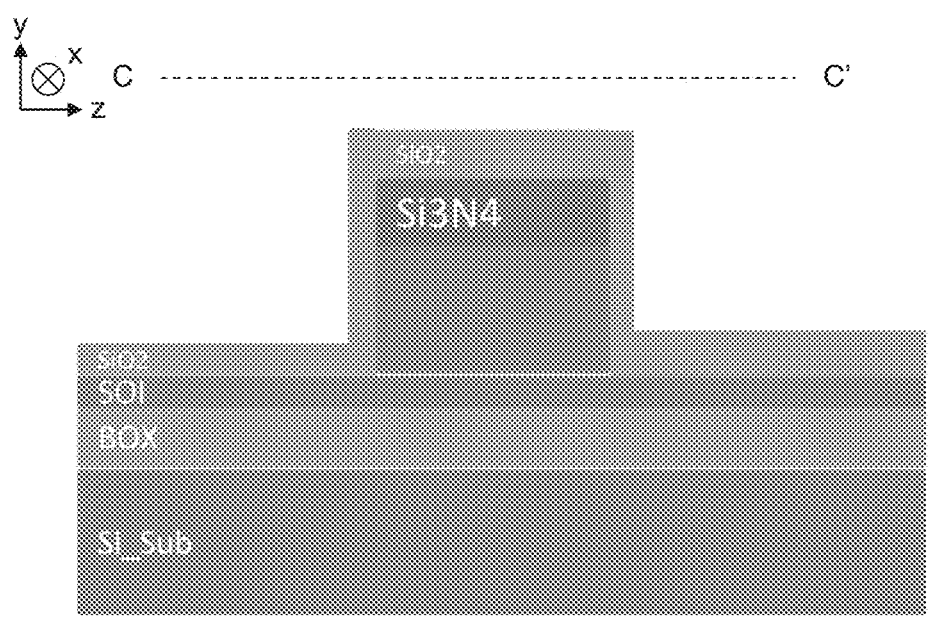
Fig. 3(v)(ii)

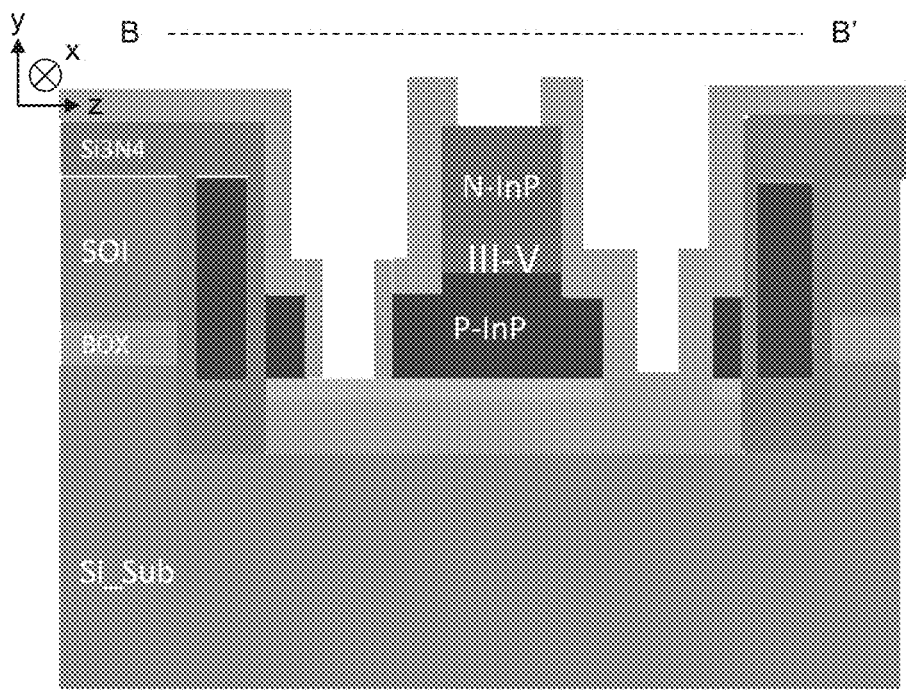
Fig. 3(w)(i)
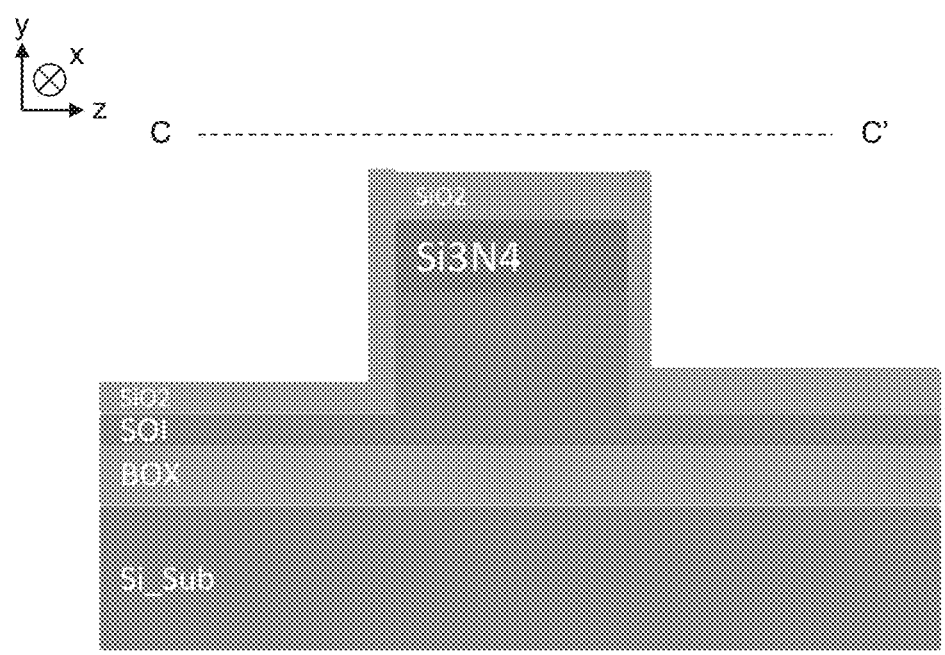
Fig. 3(w)(ii)

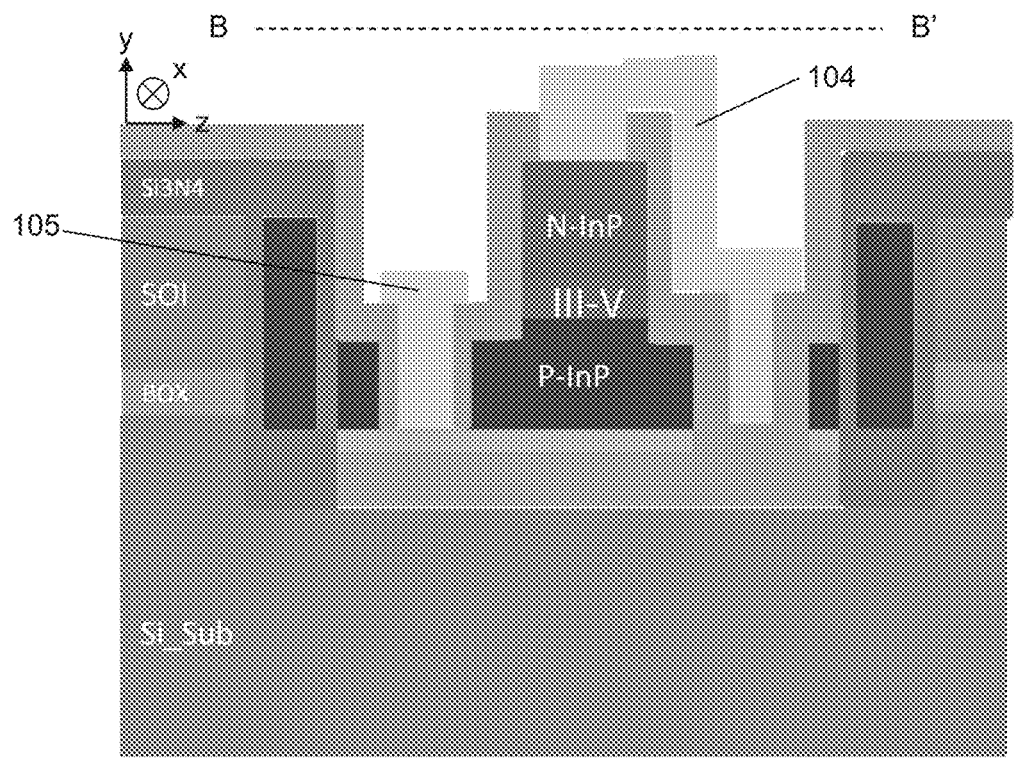
Fig. 3(x)(i)
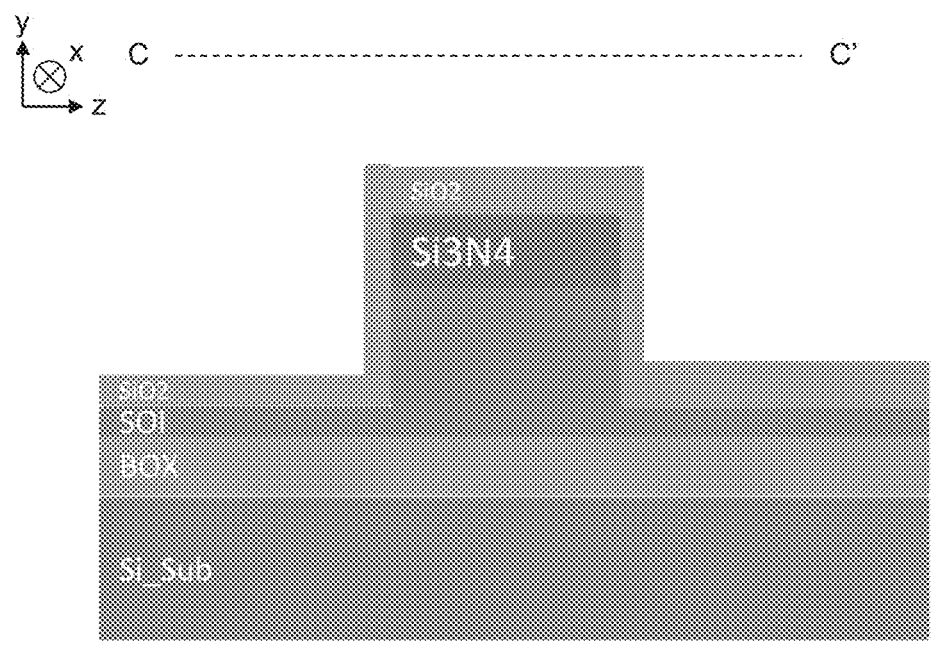
Fig. 3(x)(ii)

Fig. 3(x)(iii)

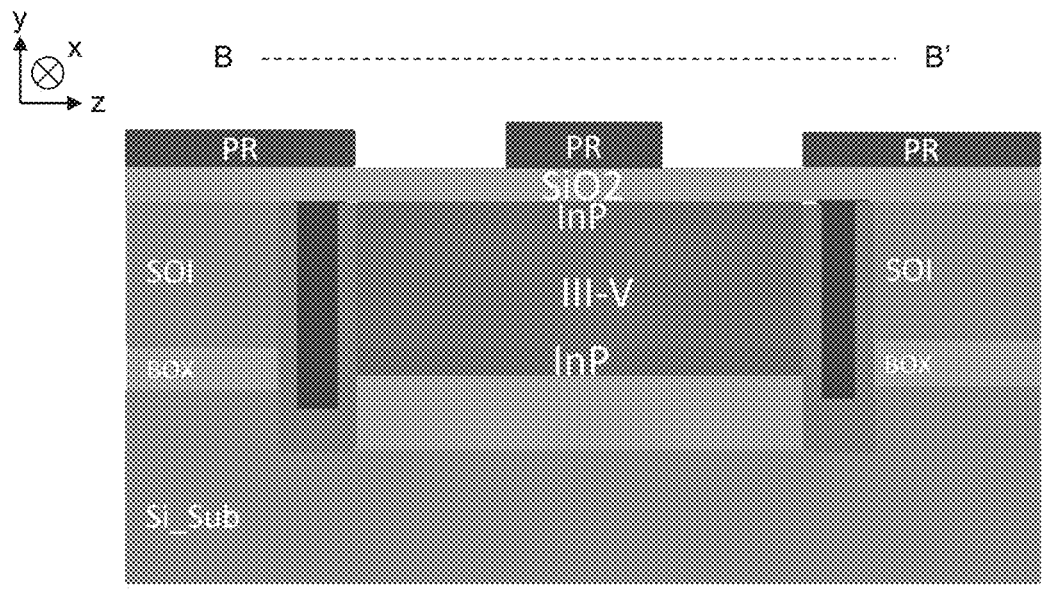
Fig. 4(p)(i)
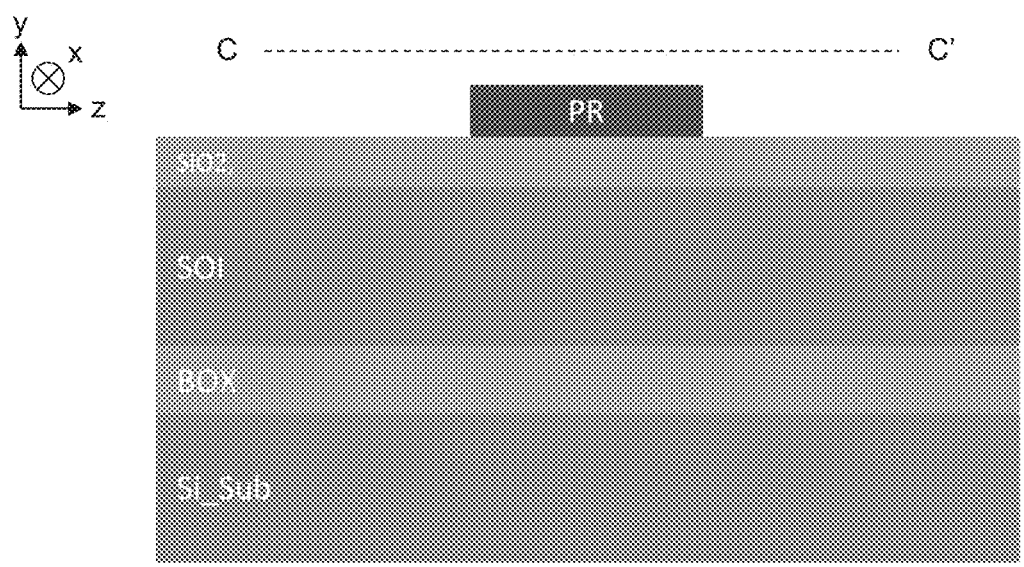
Fig. 4(p)(ii)

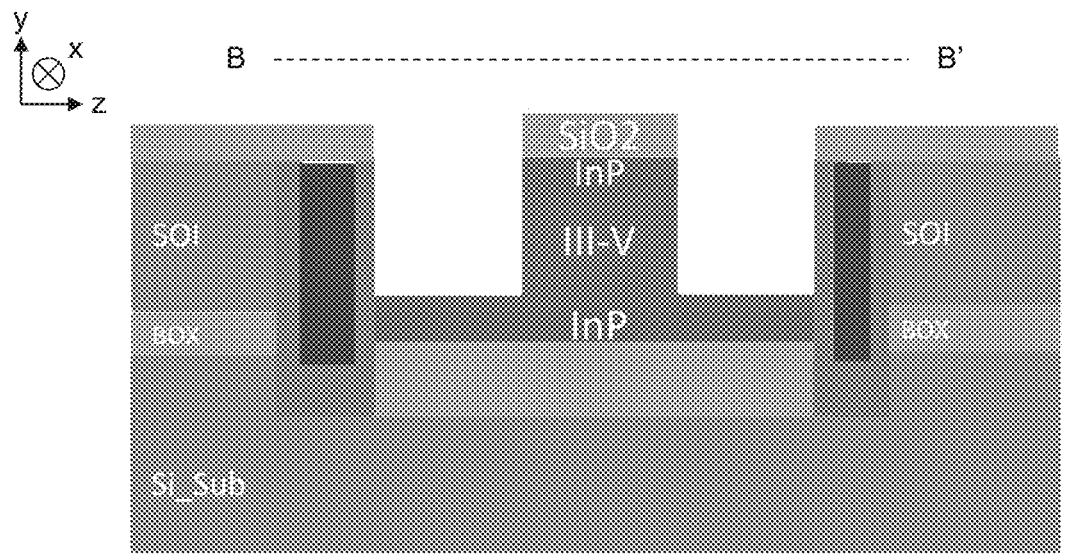
Fig. 4(q)(i)
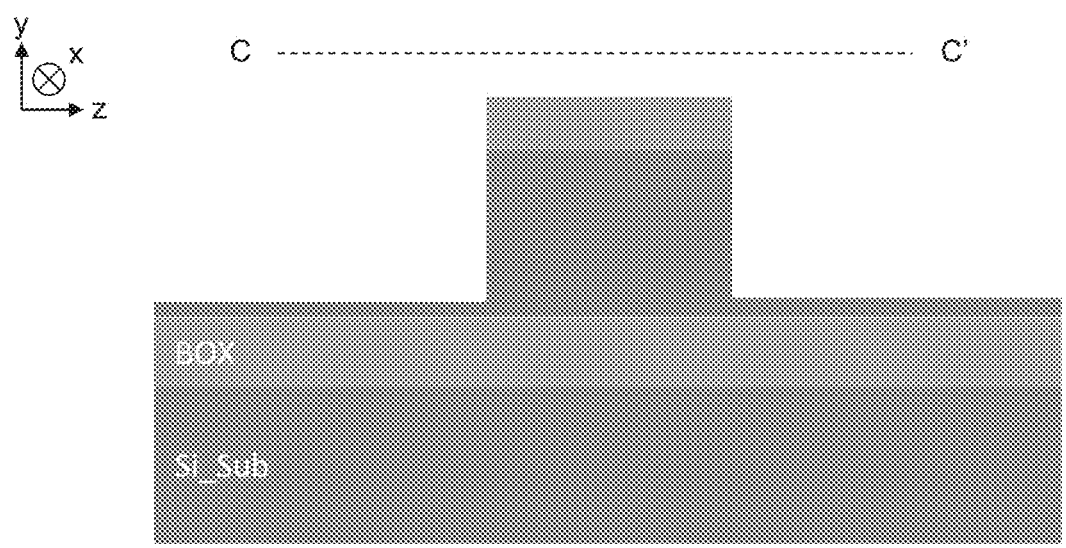
Fig. 4(q)(ii)

ID-V/SI HYBRID OPTOELECTRONIC
DEVICE AND METHOD OF MANUFACTURE

CROSS-REFERENCE TO RELATED
APPLICATIONS

This application is a National Phase Patent Application of International Patent Application Number PCT/IB2019/000565, filed on May 15, 2019, which claims priority to and the benefit of U.S. Provisional Application No. 62/672,465, filed May 16, 2018, the entire contents of both of which are incorporated herein by reference.

FIELD OF THE INVENTION

The present invention relates to methods of manufacturing an electro-optically active device, a pre-cursor electro-optically active device, a method of manufacturing a pre-cursor electro-optically active device, and a silicon based electro-optically active device.

BACKGROUND

Conventional hybrid III-V semiconductor/silicon electro-absorption modulators or lasers are fabricated and singled out to hybrid together, or by flip chip bonding or chip bonding. This process can be quite slow, and has a relatively high cost. Moreover, there is generally a high insertion loss in such devices (and also a low yield during manufacture) due to the limited waveguide alignment tolerance in three dimensions: x, y, and z.

Further, III-V semiconductor wafers need to be polished to around 100 μm for cleaving. The III-V semiconductor substrate is generally very expensive and so such polishing increases the fabrication costs. The cleaving process also has large dimensional variations which can cause alignment difficulty and therefore insertion loss.

Moreover, the provision of α-Si to fill the gap between the III-V and silicon can cause III-V facet passivation issues, or reliability issues, which degrades the III-V device performance.

SUMMARY

In a first aspect, embodiments of the invention are concerned with a method of manufacturing an electro-optically active device, the method comprising the steps of:
  etching a cavity on a silicon-on-insulator wafer;
  providing a sacrificial layer adjacent to a substrate of a III-V semiconductor wafer;
  epitaxially growing an electro-optically active structure on the III-V semiconductor wafer;
  etching the epitaxially grown optically active structure into an electro-optically active mesa;
  disposing the electro-optically active mesa in the cavity of the silicon-on-insulator wafer and bonding a surface of the electro-optically active mesa, which is distal to the sacrificial layer, to a bed of the cavity; and
  removing the sacrificial layer between the substrate of the III-V semiconductor wafer and the electro-optically active mesa.

Such a method can result in devices with improved manufacturing accuracy, and correspondingly less optical loss when used. Further, the III-V wafer can be re-used to manufacture subsequent devices. The method provides a wafer level flip-chip bonding whilst utilising standard silicon-on-insulator bonding processes. Further, self-alignment between the III-V can be achieved through an etching process performed once the electro-optically active mesa is disposed within the cavity. The method also negates the need for a passive III-V section in the device.

The method may have any one or, to the extent that they are compatible, any combination of the following optional features.

The method may include lining the cavity of the silicon-on-insulator layer and electro-optically active mesa after it has been disposed in the cavity. The liner may extend along a sidewall of the cavity, across a bed of the cavity, and up a sidewall of the electro-optically active mesa. The method may include a step, after lining the cavity of the silicon-on-insulator layer and electro-optically active mesa, or filling the remaining cavity with α-Si or another bridge-waveguide material. Such a liner can act as a passivation layer, with minimal optical insertion loss, before the remaining cavity is filled with α-Si. The liner may be made of silicon nitride, e.g. $Si_3N_4$.

The sacrificial layer may be formed of indium gallium arsenide or silicon dioxide, and may preferably be formed of indium gallium arsenide.

The method may include a step of etching sidewalls of the electro-optically active mesa after it has been bonded to the bed of cavity. This can facilitate enhanced alignment between the mesa and adjacent waveguides.

The substrate may be formed of indium phosphide. Alternatively the substrate may be formed from silicon. Preferable the substrate may be formed of indium phosphide.

The method may include a step of disposing a bonding layer on at least an uppermost exposed surface of the electro-optically active mesa. The bonding layer may be formed from silicon dioxide.

The step of disposing the optically active mesa in the cavity may include a step of inverting the III-V semiconductor wafer, such that the electro-optically active mesa is the lowermost surface of the III-V semiconductor wafer.

The sacrificial layer may be at least 1000 nm thick, as measured from an uppermost surface of the substrate to an uppermost surface of the sacrificial layer.

The electro-optically active mesa may be at least partially formed from any one or more of: indium phosphide, aluminium indium gallium arsenide, and indium gallium arsenide.

In a second aspect, embodiments of the invention are concerned with a method of manufacturing an electro-optically active device, the method comprising the steps of:
  providing a III-V semiconductor wafer, the wafer comprising:
    a substrate, a sacrificial layer, and electro-optically active mesa;
  wherein the sacrificial layer is between the substrate and the electro-optically active mesa;
  providing a silicon-on-insulator wafer, including a cavity etched therein;
  disposing the optically active mesa in the cavity of the silicon-on-insulator wafer, and bonding a surface of the electro-optically active mesa, which is distal to the sacrificial layer, to a bed of the cavity; and
  removing the sacrificial layer between the substrate of the III-V semiconductor wafer and the electro-optically active mesa.

Such a method can result in devices with improved manufacturing accuracy, and correspondingly less optical loss when used. Further, the III-V wafer can be re-used to manufacture subsequent devices.

The method may have any one or, to the extent that they are compatible, any combination of the following optional features.

The method may include lining the cavity of the silicon-on-insulator layer and electro-optically active mesa after it has been disposed in the cavity. The liner may extend along a sidewall of the cavity, across a bed of the cavity, and up a sidewall of the electro-optically active mesa. The method may include a step, after lining the cavity of the silicon-on-insulator layer and electro-optically active mesa, or filling the remaining cavity with α-Si or another bridge-waveguide material. Such a liner can act as a passivation layer, with minimal optical insertion loss, before the remaining cavity is filled with α-Si. The liner may be made of silicon nitride, e.g. $Si_3N_4$.

The sacrificial layer may be formed of indium gallium arsenide or silicon dioxide, and preferable may be formed from indium gallium arsenide.

The substrate may be formed of indium phosphide or silicon, and preferable may be formed from silicon.

The electro-optically active mesa may include a bonding layer, located distal to the sacrificial layer. The bonding layer may be formed from silicon dioxide.

The step of disposing the optically active mesa in the cavity may include a step of inverting the III-V semiconductor wafer, such that the electro-optically active mesa is the lowermost surface of the III-V semiconductor wafer.

The sacrificial layer may be at least 1000 nm thick as measured from an uppermost surface of the substrate to an uppermost surface of the sacrificial layer.

The electro-optically active mesa may be at least partially formed from any one or more of: indium phosphide, aluminium indium gallium arsenide, and indium gallium arsenide.

In a third aspect, embodiments of the present invention are concerned with a pre-cursor electro-optically active device, formed on a III-V semiconductor wafer, the pre-cursor device comprising:
 a substrate;
 a sacrificial layer; and
 an electro-optically active mesa, suitable for disposing in a cavity of a silicon-on-insulator wafer;
 wherein the sacrificial layer is positioned between the substrate and the electro-optically active mesa.

Such a pre-cursor electro-optically active device can be used with the methods of the first or second aspects. Further, the substrate III-V wafer can be re-used to manufacture subsequent pre-cursor devices.

The pre-cursor device may have any one or, to the extent that they are compatible, any combination of the following optional features.

The sacrificial layer may be formed of indium gallium arsenide or silicon dioxide, and may preferably be formed from indium gallium arsenide.

The substrate may be formed of indium phosphide or silicon, and preferably may be formed from silicon.

The electro-optically active mesa may include a bonding layer, and the bonding layer may be distal to the sacrificial layer. The bonding layer may be formed from silicon dioxide.

The step of disposing the optically active mesa in the cavity may include a step of inverting the III-V semiconductor wafer, such that the electro-optically active mesa is the lowermost surface of the III-V semiconductor wafer.

The sacrificial layer may be at least 1000 nm thick as measured from an uppermost surface of the substrate to an uppermost surface of the sacrificial layer.

The electro-optically active mesa may be at least partially formed from any one or more of: indium phosphide, aluminium indium gallium arsenide, and indium gallium arsenide.

In a fourth aspect, embodiments of the invention are concerned with a method of manufacturing a pre-cursor electro-optically active device, the method comprising the steps of:
 providing a III-V semiconductor wafer, having a substrate;
 disposing a sacrificial layer on the substrate;
 epitaxially growing an electro-optically active structure on an opposing side of the sacrificial layer to the substrate; and
 etching the electro-optically active structure to provide an electro-optically active mesa.

Such a method can produce a pre-cursor electro-optically active device for use with the methods of the first and second aspects. Moreover, the substrate of such a device can be reused.

The method may have any one or, to the extent that they are compatible, any combination of the following optional features.

The sacrificial layer may be formed of indium gallium arsenide or silicon dioxide, and may preferably be formed from indium gallium arsenide.

The substrate may be formed of indium phosphide or silicon, and preferable is formed from indium phosphide.

The method may further include a step of disposing a bonding layer on at least an uppermost exposed surface of the electro-optically active mesa. The bonding layer may be formed from silicon dioxide.

The sacrificial layer may be at least 1000 nm thick as measured from an uppermost surface of the substrate to an uppermost surface of the sacrificial layer.

The electro-optically active mesa is at least partially formed from any one or more of: indium phosphide, aluminium indium gallium arsenide, and indium gallium arsenide.

In a fifth aspect, embodiments of the present invention are concerned with a silicon based electro-optically active device comprising:
 a silicon-on-insulator, SOI, waveguide;
 an electro-optically active waveguide, including an electro-optically active stack within a cavity of the SOI waveguide; and
 a lined channel between the electro-optically active stack and the SOI waveguide, the lined channel comprising a liner;
 wherein the lined channel is filled with a filling material to thereby form a bridge-waveguide in the channel between the SOI waveguide and the electro-optically active stack, and there is an insulator layer located between the electro-optically active stack and a bed of the cavity of the SOI waveguide.

Such a device can be manufactured with more accuracy than previous devices, and therefore incur less optical loss in use.

The device may have any one or, to the extent that they are compatible, any combination of the following optional features.

The liner may be formed of silicon nitride, $Si_3N_4$. The liner can act as a passivation layer, with minimal optical insertion loss. The filling material may be α-Si.

The device may further comprise a buried oxide layer, located between the silicon-on-insulator waveguide and a substrate, and the insulator layer may not be horizontally aligned with the buried oxide.

The device may further comprise a buried oxide layer, located between the silicon-on-insulator waveguide and a substrate, and the cavity may extend beyond the buried oxide layer and the insulator layer may be located beneath the buried oxide layer.

The device may further comprise a buried oxide layer, located between the silicon-on-insulator waveguide and a substrate, wherein a shortest distance between an uppermost surface of the insulator layer and an uppermost surface of the silicon-on-insulator waveguide is similar (e.g. substantially equal to) to or greater than a shortest distance from an uppermost surface of the buried oxide layer to the uppermost surface of the silicon-on-insulator waveguide.

The electro-optically active stack may be at least partially formed from any one or more of indium phosphide, aluminium indium gallium arsenide, and indium gallium arsenide.

The electro-optically active stack may include a multiple quantum well region and may be operable as a quantum-confined Stark effect modulator.

The electro-optically active stack may include a first doped region and a second doped region, positioned opposite to one another across a waveguide, and the electro-optically active stack may be operable as an electro-absorption modulator. The first and second doped regions may be vertically opposite to one another across the waveguide, to provide a vertical PN or PIN junction. Alternatively, the first and second doped regions may be horizontally opposite to one another across the waveguide, to provide a horizontal PN or PIN junction. The electro-optically active stack may be operable as a Franz-Keldysh effect electro-absorption modulator.

The device may include a first electrode and a second electrode, which respectively contact regions of the electro-optically active stack.

The insulator layer may be formed of silicon dioxide.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
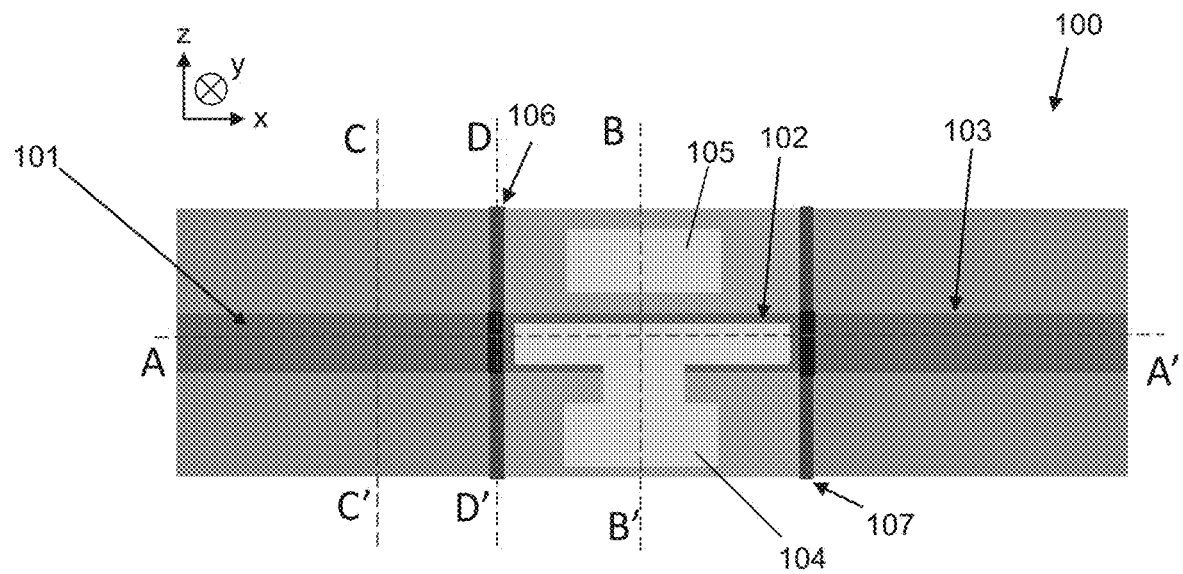
FIG. 1 shows a top-down view of a III-V on silicon hybrid electro-optically active device which is an embodiment of the invention and was manufactured using an embodiment of the invention.

Aspects and embodiments of the present invention will now be discussed with reference to the accompanying figures. Further aspects and embodiments will be apparent to those skilled in the art. All documents mentioned in this text are incorporated herein by reference FIG. 1 shows a top down view of a III-V on silicon hybrid electro-optically active device 100 which is an embodiment of the invention. Broadly, the device includes a first silicon-on-insulator (SOI) waveguide 101, an electro-optically active waveguide 102 containing an electro-optically active stack, and a second SOI waveguide 103. The first SOI waveguide 101 and the electro-optically active waveguide 102 are connected via first bridge waveguide 106. The electro-optically active waveguide 102 and the second SOI waveguide 103 are connected via second bridge waveguide 107. The device also includes a first electrode 104 and a second electrode 105, which provide electrical connections to respective portions of the electro-optically active stack. All waveguides guide light generally along the x axis.

Figure 2A:
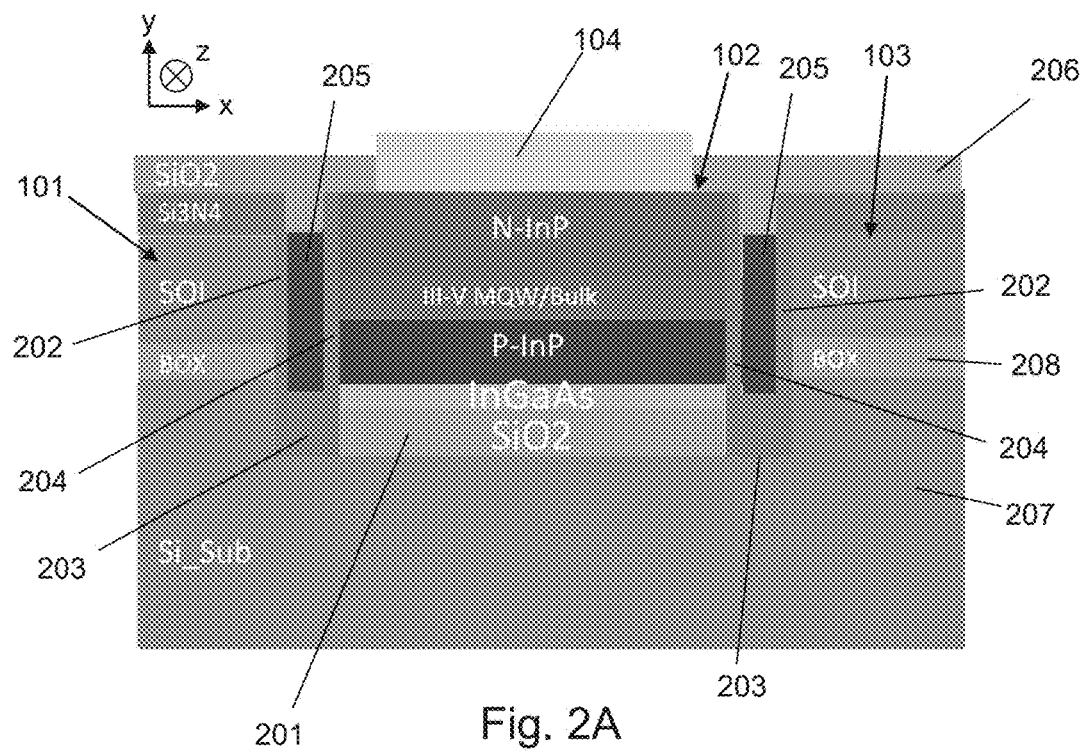
FIGS. 2A-2D show cross-sections of FIG. 1 along the lines A-A', B-B', C-C', and D-D'.

FIGS. 2A-2D shows cross-sections of FIG. 1 along the lines A-A', B-B', C-C', and D-D' respectively. FIG. 2A shows an upper cladding or passivation layer 206 which was omitted from FIG. 1 for the sake of clarity. The electrodes 104 and 105 extend through upper cladding layer. this As can also be seen, the device is provided on a silicon substrate 201, which includes a buried oxide layer 208 which functions as the lower cladding layer for the SOI waveguides 101 and 103. There is also a $Si_3N_4$ layer between the SOI waveguides and the upper cladding layer (also omitted from FIG. 1 for the sake of clarity).

FIG. 2A also shows the structure of the bridge waveguides 106 and 107 in more detail. Broadly, each bridge waveguide is formed of a silicon nitride (e.g. $Si_3N_4$) liner which extends down a sidewall of the respective SOI waveguide, along a bottom surface adjacent to the substrate (which is the bed of the cavity before the cavity is filled, as is discussed later), and up a corresponding sidewall of the electro-optically active stack. The gap between the silicon nitride sidewalls is filled with amorphous or a silicon (α-Si). The electro-optically active stack can be seen in more detail in FIG. 2A, and comprises, in order from the layer adjacent to the electrode downwards towards the substrate: an n doped indium phosphide (InP) layer; a III-V semiconductor multiple quantum well or bulk III-V layer; a p doped InP layer; and a p doped indium gallium arsenide (InGaAs) layer. Between the InGaAs layer and the substrate there is an insulator layer, formed of silicon dioxide ($SiO_2$).

Figure 2B:
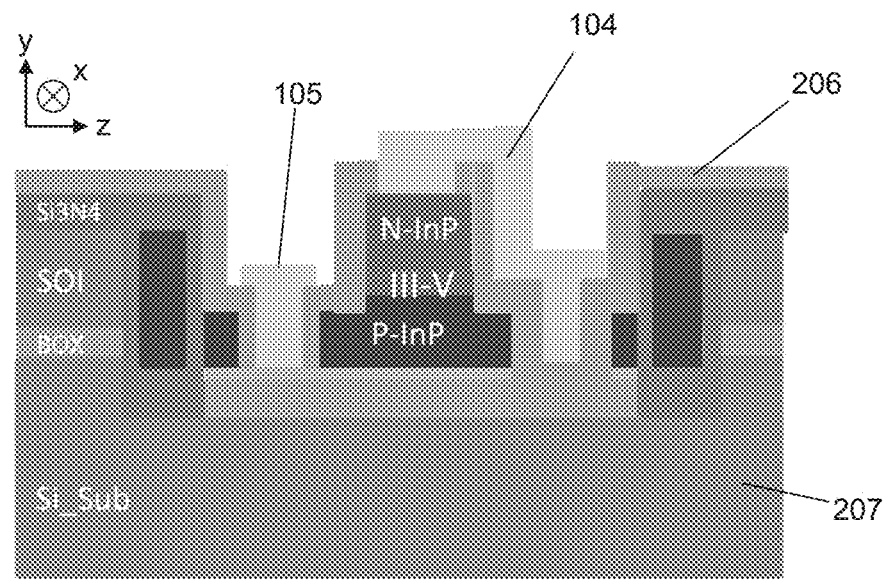

FIG. 2B shows the device along the cross-section B-B', such that light is guided into/out of the plane of the figure. Of note, is that first electrode 104 extends up a sidewall of the device, so as to electrically contact the upper n doped InP layer. In contrast, the second electrode 105 extends through a via in the p doped InP layer so as to electrically contact the InGaAs layer. Accordingly, the electro-optically active stack can be used as a vertical junction electro-absorption modulator, in that an electric field can be applied from the first electrode to the second electrode in the y direction.

Figure 2C:
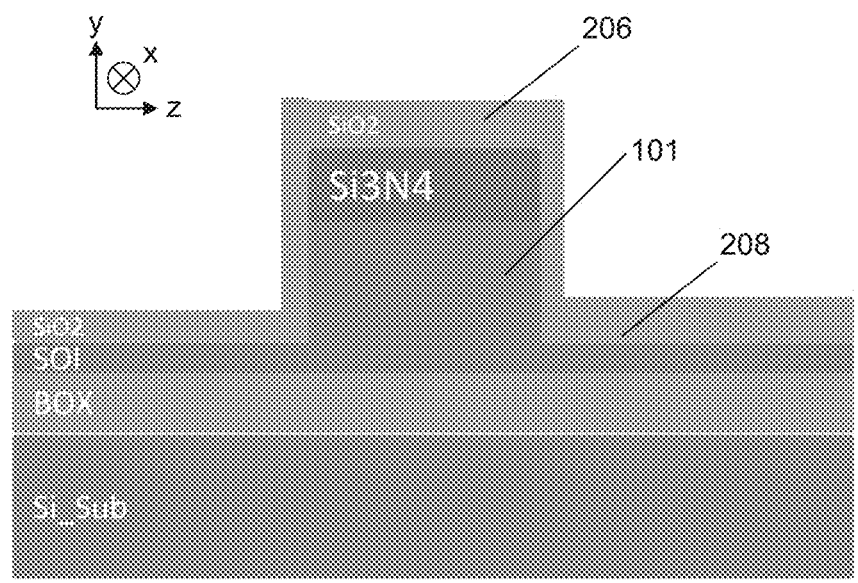
Figure 2D:
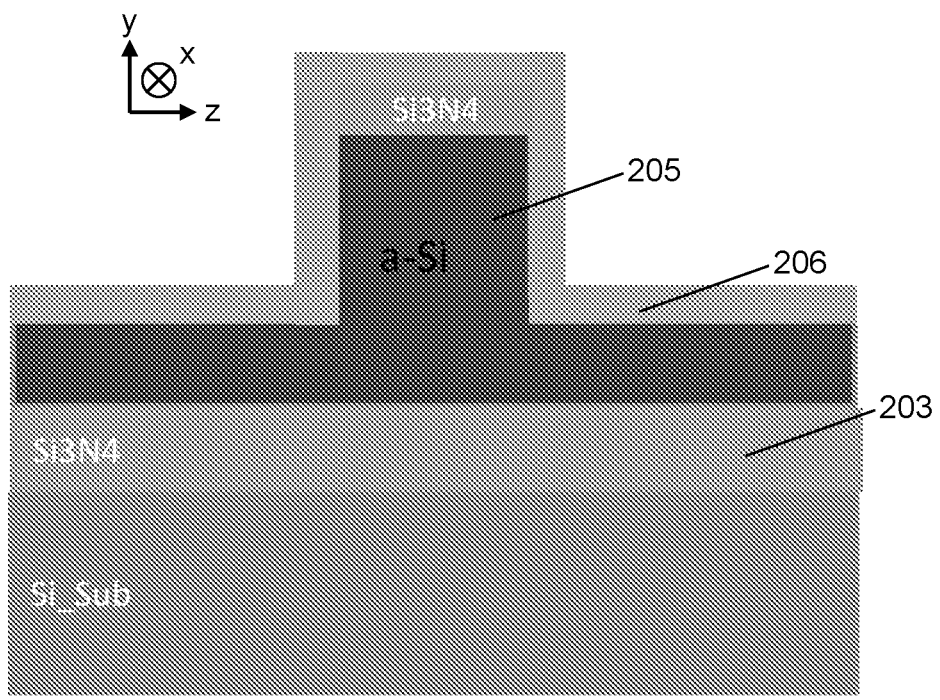

FIGS. 2C and 2D show a first SOI waveguide 101 and a bridge waveguide 206 respectively. The two are adjacent, such that light is guided from the SOI waveguide into the bridge waveguide 206 and through into the electro-optically active waveguide 102.

In some examples, the electro-optically active stack may be formed of the following layers:

| Layer | Repeat | n/u/p | Material | Thickness | $E_g$ (nm) | Doping ($\times 10^{18}$) | Dopant |
|---|---|---|---|---|---|---|---|
| 15 | 1 | P | InGaAs | 400 | 1499.98 | 1 | Zn |
| 14 | 1 | P | InGaAsP | 50 | 1302.91 | 1.5 | Zn |
| 13 | 1 | P | InP | 1340 | 918.407 | 1 | Zn |
| 12 | 1 | P | InGaAsP | 20 | 1302.91 | 1 | Zn |
| 11 | 1 | P | AlInGaAs | 60 | 843.435 | 1 | C |
| 10 | 1 | uid | AlInGaAs | 70 | 968.035 | | |
| 9 | 12x | uid | AlInGaAs | 7 | 1127.14 | | |
| 8 | 12x | Active | AlInGaAs | 9 | 1278.2 | | |
| 7 | 1 | uid | AlInGaAs | 7 | 1127.14 | | |
| 6 | 1 | uid | InGaAsP | 77 | 1100 | | |
| 5 | 1 | N | InP | 80 | 918.407 | 0.2 | Si |
| 4 | 1 | N | InP | 70 | 918.407 | 0.5 | Si |
| 3 | 1 | N | InP | 920 | 918.407 | 0.8 | Si |
| 2 | 1 | N | InGaAs | 1000 | 1499.98 | 1 | Si |
| 1 | | | Substrate: semi-insulating and n doped InP | | | | |

Layer 2 is termed the sacrificial layer, and is used in the bonding process. 'uid' refers to unintentionally doped layers, $E_g$ refers to the band gap energy of the layer. It should be noted that, once bonded, layer 15 becomes the layer closest to the bed of the cavity whereas layer 3 is the layer furthest from the bed of the cavity and connected to the first electrode.

Alternatively, the electro-optically active stack may be a SiGe multiple-quantum well (MQW stack built on an SOI wafer with a thin device layer, and the buried oxide layer may be used as the sacrificial layer:

| Layer | Repeat | n/u/p | Material | Thickness (nm) | Doping ($\times 10^{18}$) | Dopant |
|---|---|---|---|---|---|---|
| 10 | 1 | N | $Si_{0.8}Ge_{0.2}$ | 400 | 10 | P |
| 9 | 1 | N | $Si_{0.18}Ge_{0.82}$ | 400 | 1 | P |
| 8 | 1 | uid | $Si_{0.18}Ge_{0.82}$ | 15 | | |
| 7 | 8x | uid | $Si_{0.33}Ge_{0.67}$ | 7 | | |
| 6 | 8x | Active | Ge | 10 | | |
| 5 | 1 | uid | $Si_{0.33}Ge_{0.67}$ | 12 | | |
| 4 | 1 | uid | $Si_{0.18}Ge_{0.82}$ | 15 | | |
| 3 | 1 | P | $Si_{0.18}Ge_{0.82}$ | 400 | 1 | B |
| 2 | 1 | P | $Si_{0.8}Ge_{0.2}$ | 400 | 1 | B |
| 1 | | | P SOI layer (100-220 nm) | | | |
| | | | BOX (Sacrificial layer) | | | |
| | | | Substrate: (100) Si | | | |

In a further alternative, the electro-optically active stack may be formed of the following layers:

| Layer | Repeat | n/u/p | Material | Thickness (nm) | $E_g$ (nm) | Doping ($\times 10^{18}$) | Dopant |
|---|---|---|---|---|---|---|---|
| 9 | 1 | P | InGaAs | 400 | 1499.98 | 1 | Zn |
| 8 | 1 | P | InGaAsP | 50 | 1302.91 | 1.5 | Zn |
| 7 | 1 | P | InP | 1340 | 918.407 | 1 | Zn |
| 6 | 1 | uid | InGaAsP | 500 | 1260 | | |
| 5 | 1 | N | InP | 80 | 918.407 | 0.2 | Si |
| 4 | 1 | N | InP | 70 | 918.407 | 0.5 | Si |
| 3 | 1 | N | InP | 920 | 918.407 | 0.8 | Si |
| 2 | 1 | N | InGaAs | 1000 | 1499.98 | 1 | Si |
| 1 | | | Substrate: semi-insulating and n doped InP | | | | |

Layer 2 is termed the sacrificial layer, and is used in the bonding process. It should be noted that, once bonded, layer 9 becomes the layer closest to the bed of the cavity whereas layer 3 is the layer furthest from the bed of the cavity and connected to the first electrode.

Figure 3A:
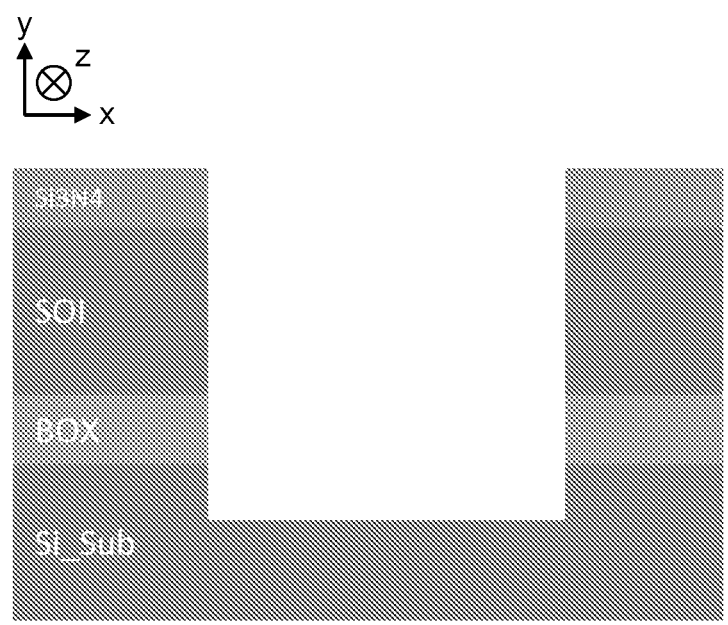
FIGS. 3(a)-3(x)(iii) show various manufacturing stages of the device in FIG. 1.

FIGS. 3(a)-3(x)(iii) show various manufacturing steps of a method according to embodiments of the present invention. In a first step, shown in FIG. 3(a), a cavity is made within an SOI wafer which has been previously capped with silicon nitride ($Si_3N_4$). The cavity has a depth, as measured from the bottom of the cavity to the upper surface of the silicon nitride layer, which will mean that the optical mode of the SOI waveguide subsequently manufactured will be aligned with the optical mode of the III-V electro-optically active waveguide once fabricated and bonded to the cavity. The silicon nitride is silicon rich, with a refractive index of 2.7.

Figure 3B:
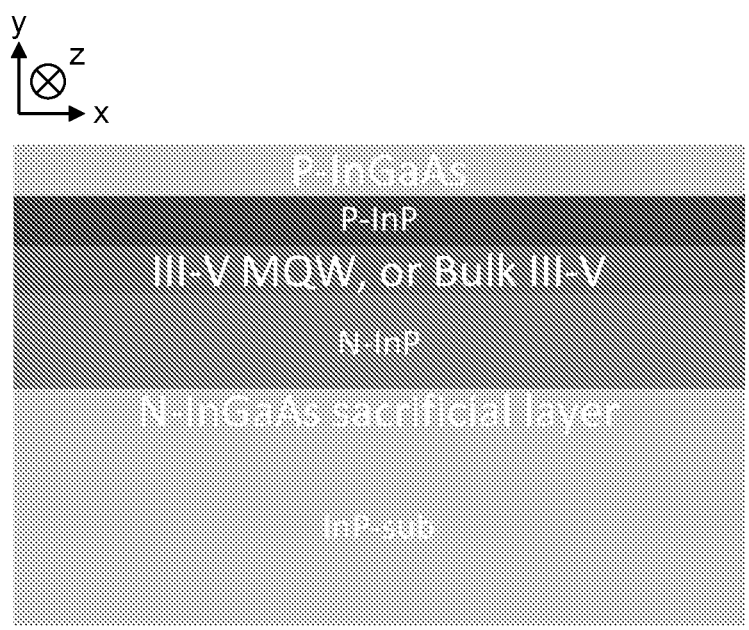
Figure 3C:
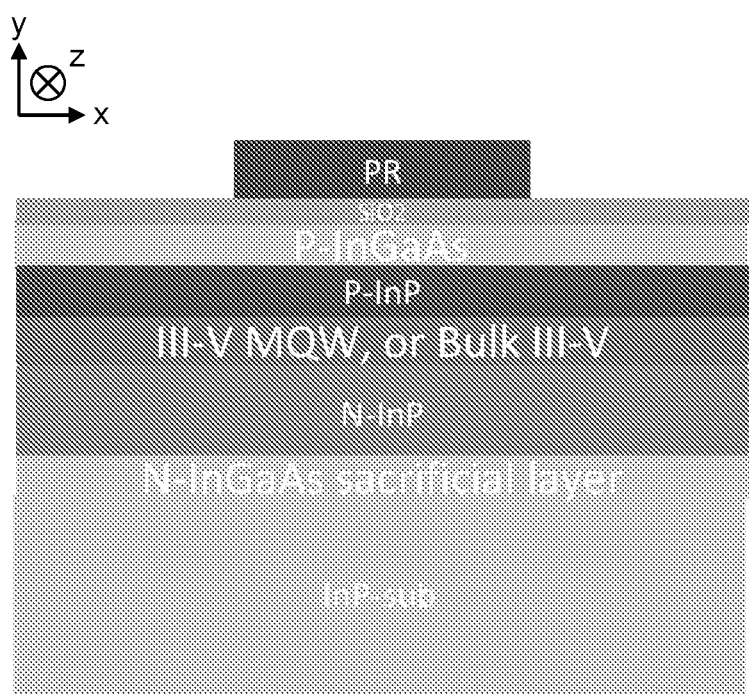

Subsequently, in parallel, or before to the steps shown previously, a III-V electro-optically active stack is grown (and preferably epitaxially grown) on an indium phosphide wafer as shown in FIG. 3(b). The stack may have the composition as discussed previously. A silicon dioxide layer is then disposed on the upper surface of the stack, as is a photoresist. The stack includes a sacrificial layer, in this example formed of n doped InGaAs. The silicon dioxide layer has a thickness of around 500 nm. The result of this is shown in FIG. 3(c).

After the photoresist is provided, an etch is performed partially into the sacrificial layer. The etch removes any facets, and provides a clean sidewall. This etch also forms the electro-optically active mesa referred to above. The etch is performed such that a gap will exist between the sacrificial layer and the top surface of the silicon nitride layer in the SOI wafer in FIG. 3(a). This is to ensure that after bonding an etchant can be provided to the sacrificial layer.

Figure 3D:
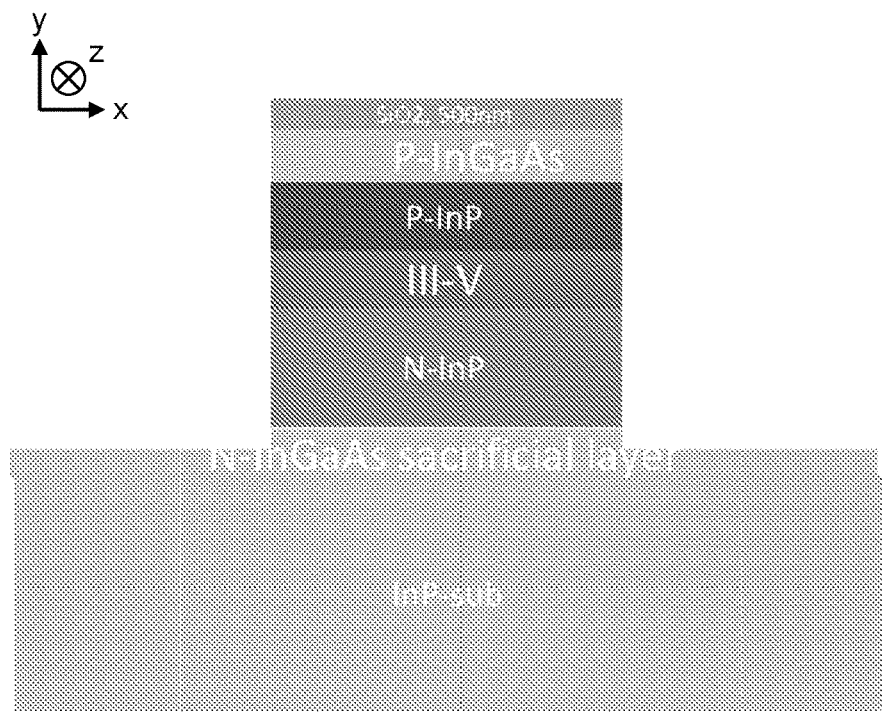
Figure 3E:
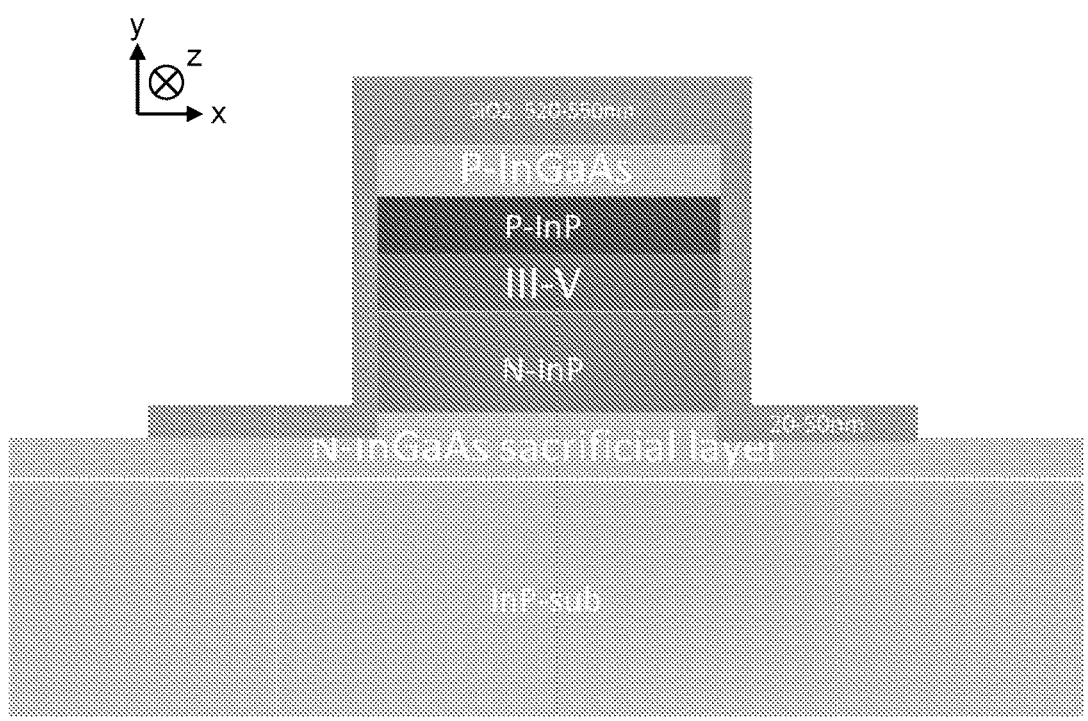

After the etch in FIG. 3(d) has been performed, a silicon dioxide coating is provided over the device and then partially removed as indicated in the figure. The silicon dioxide coating is between 20 nm and 50 nm thick. The silicon dioxide either side of the mesa is removed, leaving a portion which extends from the mesa along an upper surface of the sacrificial layer.

Figure 3F:
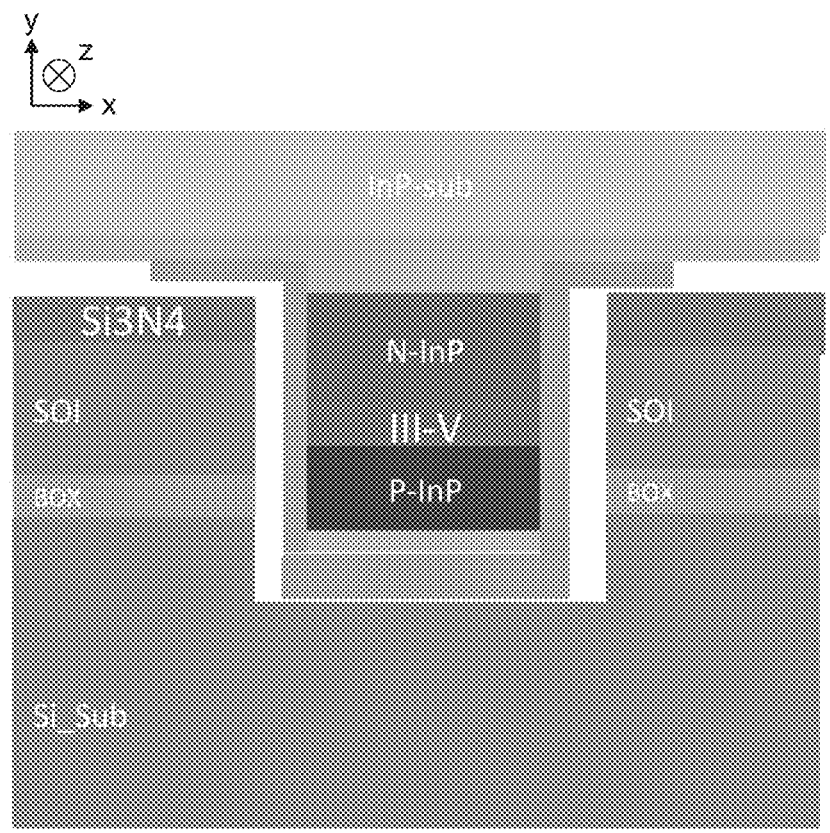

After the silicon dioxide has been provided and partially removed, a flip-chip bonding process is performed. The electro-optically active mesa is provided within the cavity of the SOI wafer (as shown in FIG. 3(f)). The silicon dioxide layer is then bonded to the bed of the cavity. Of note, is that the $Si_3N_4$ top surface on the SOI wafer has a height which is similar to that of the N—InP top surface (which was the bottom surface, before the indium phosphide wafer was inverted).

Figure 3G:
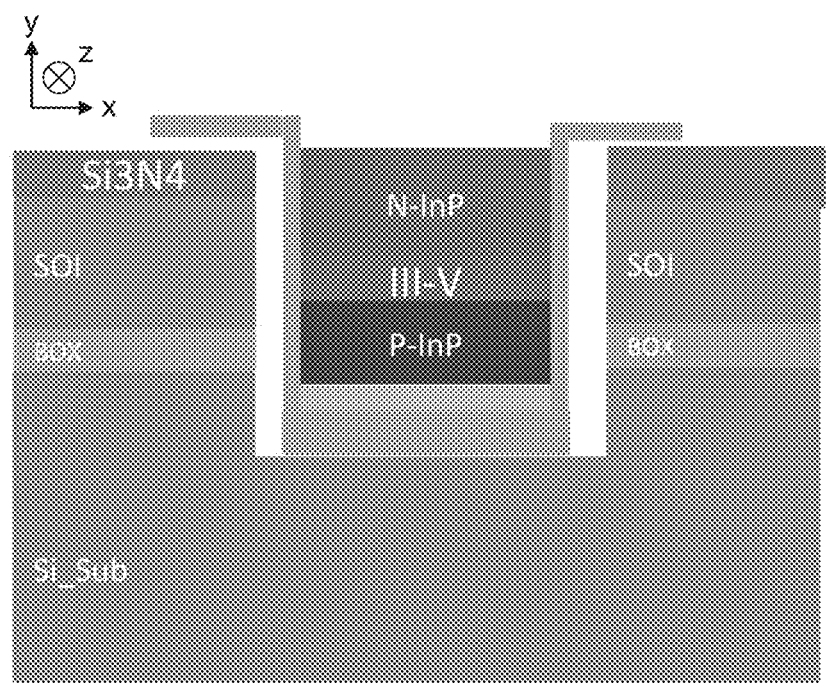
Figure 3H:
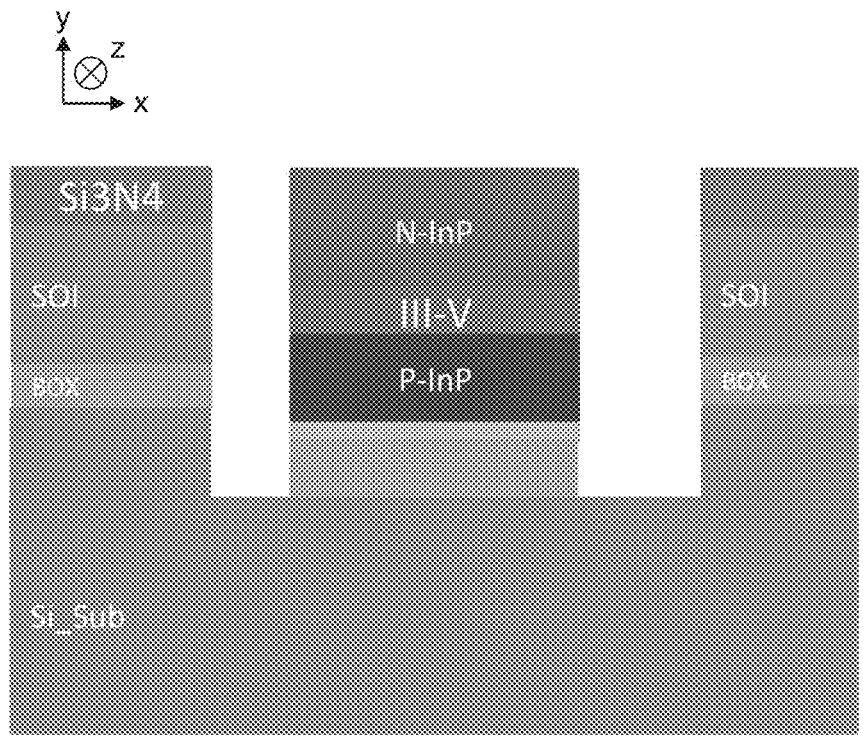

After bonding is complete, a wet etch is performed to remove the sacrificial layer. This allows the indium phosphide substrate to be retrieved and reused in growing subsequent electro-optically active mesas. The result of this wet etch is shown in FIG. 3(g). After the first wet etch, a further wet etch is performed to remove the silicon dioxide layer. This is shown in FIG. 3(h). The silicon dioxide layer which is between the stack and the cavity bed is retained.

Figure 3I:
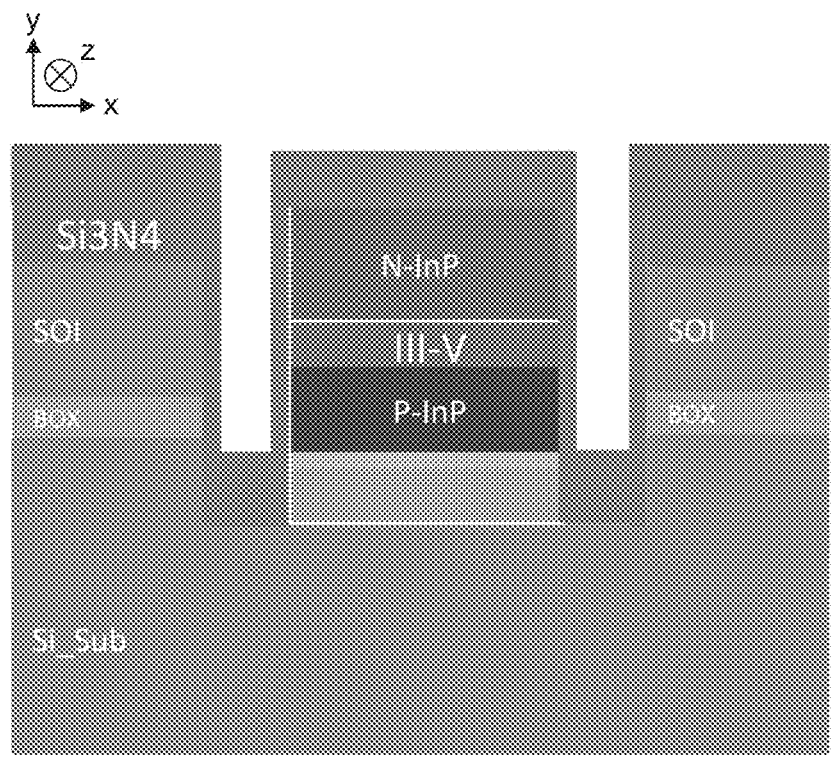
Figure 3J:
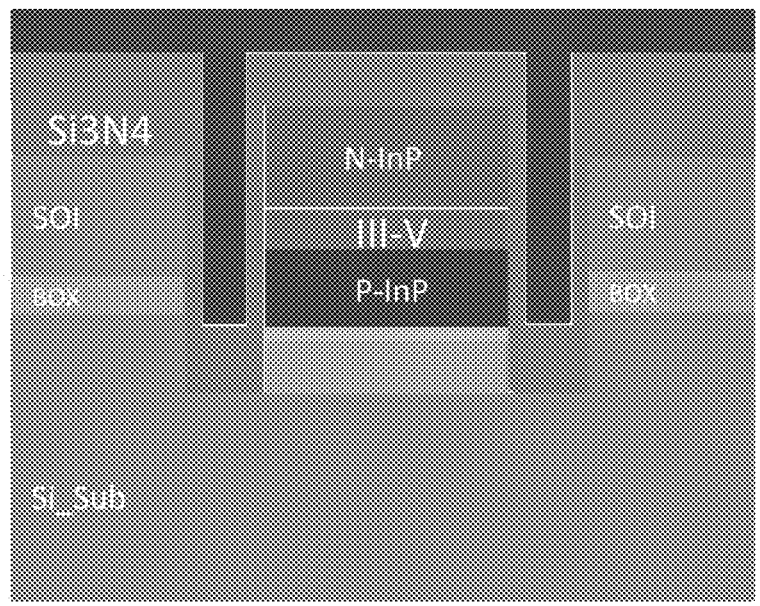

Next, as shown in FIG. 3(i), a silicon nitride (and preferable silicon rich, e.g. $Si_3N_4$) layer is deposited across the exposed surfaces. This results in a silicon nitride layer on the bed of the cavity, along the sidewall of the first SOI waveguide within the cavity, along both side walls of the optically active stack, and along the sidewall of the second SOI waveguide. The silicon nitride layer on the sidewalls may be between 230 nm and 260 nm thick, and may have a refractive index of around 2.7. The silicon nitride layer on the bed, and the exposed upper surfaces, may be thicker than the silicon nitride layer on the sidewalls. The height of the silicon nitride layer on the bed of the cavity may be substantially equal the height of the lowermost surface of the buried oxide layer adjacent to the silicon nitride layer, or substantially equal the height of the uppermost surface of the buried oxide layer adjacent to the silicon nitride layer depending on the deposition ratio of sidewall over the bed.

After the silicon nitride layer is deposited, amorphous or α-Silicon is deposited within the remaining voids of the cavity (which may be, in this example, a trench extending around the electro-optically active stack). The amorphous silicon provides a bridge waveguide from each SOI waveguide (when formed, as discussed below) into the electro-optically active stack. The deposition of α-Silicon may be through blanket deposition.

Figure 3K:
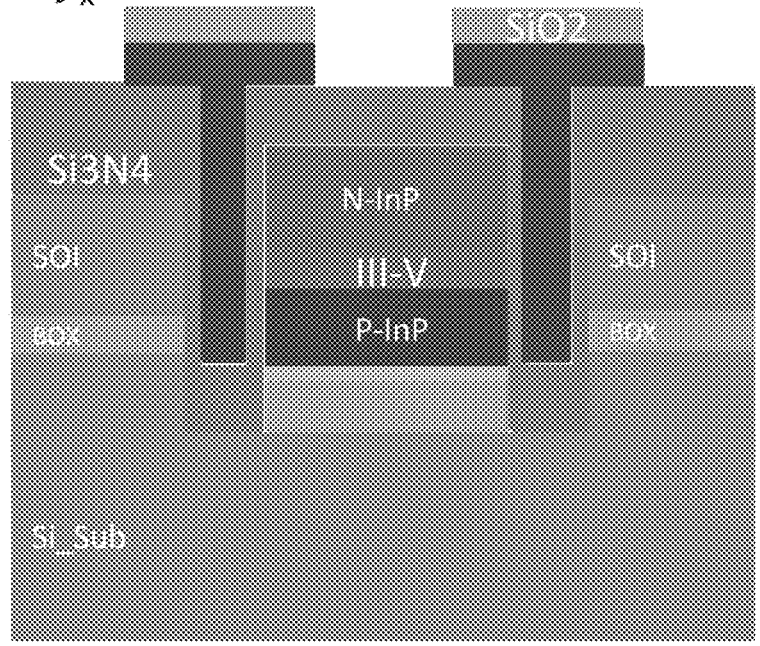

After the α-Silicon has been provided, a mask may be provided over the regions of the α-Silicon fill which are within the cavity (and slightly around the cavity, as shown in FIG. 3(k)). The unmasked regions are then etched, which improves the uniformity of the chemical-mechanical polishing process used subsequently. The etch can also release any wafer stress. The mask is, in this example, silicon dioxide.

Figure 3L:
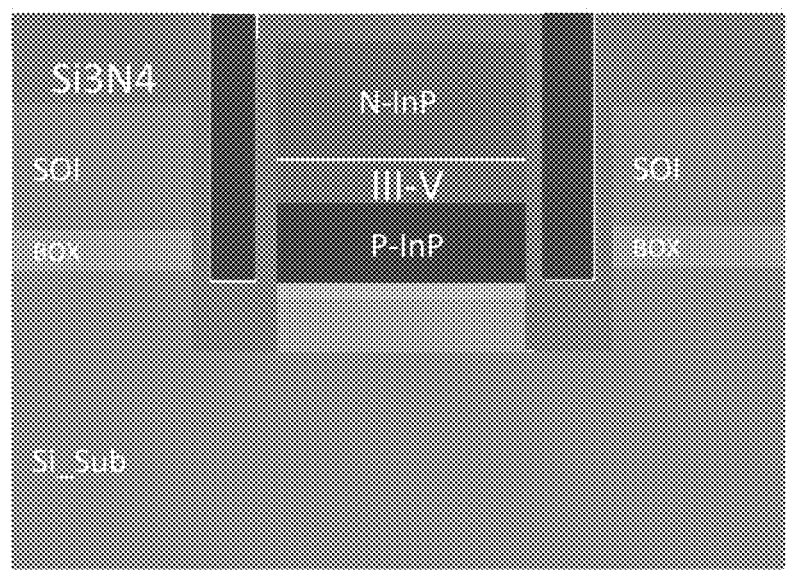
Figure 3M:
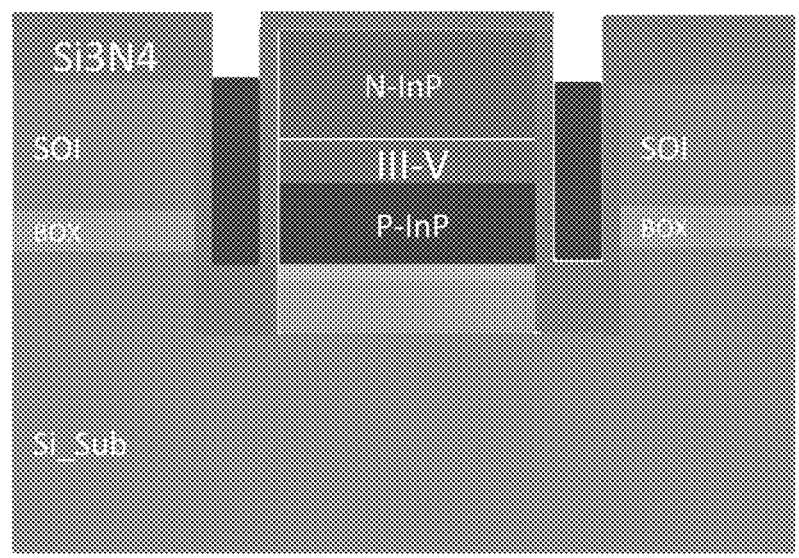

After the etching, a chemical-mechanical polishing process is used to provide a uniform upper surface. The result of this is shown in FIG. 3(l). Approximately 100 nm of silicon nitride is retained above the uppermost layer of the electro-optically active stack, as seen. A further dry etch is then performed, in order to make the uppermost surface of the α-Silicon layer level with the uppermost surface of the SOI waveguides on either side of the electro-optically active stack. The result of this etch is shown in FIG. 3(m).

Figure 3N:
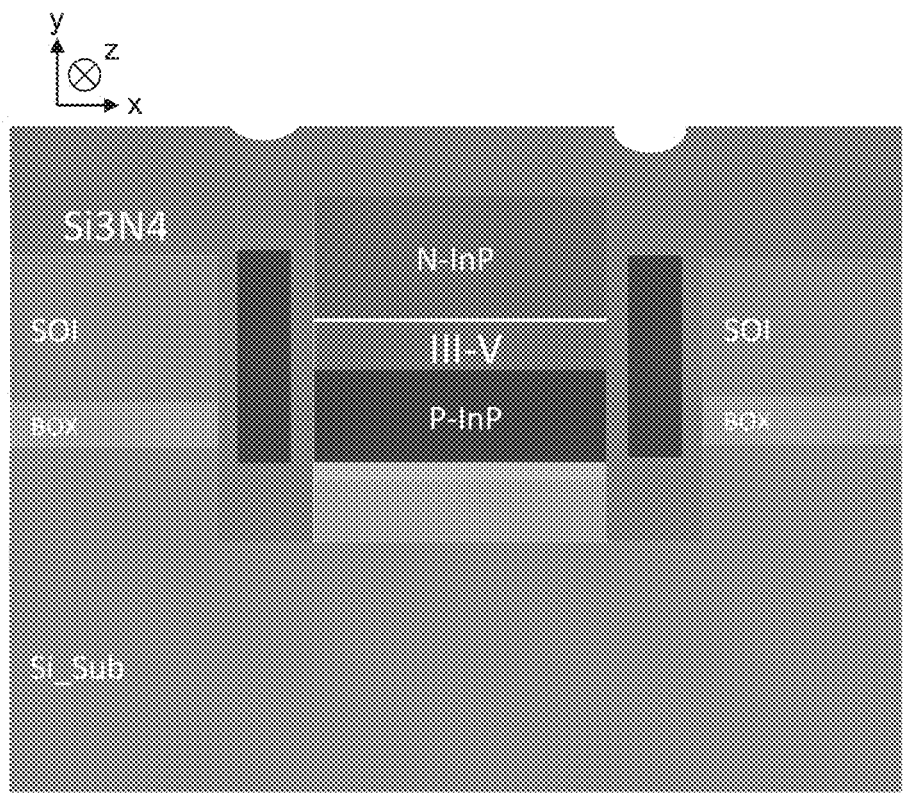

In a next step, shown in FIG. 3(n), further silicon nitride is deposited to cover the trench and provide a thicker layer over the top of the electro-optically active stack. After this is provided, a further chemical-mechanical polish process is performed to remove the silicon nitride layer above the uppermost layer of the electro-optically active stack, and to level the uppermost surface of the device. Therefore, the silicon nitride layers either side of the electro-optically active stack (which extend from above the SOI waveguides and across the α-Silicon fill) have an uppermost surface which is level with the uppermost surface of the uppermost layer of the electro-optically active stack. The result of this is shown in FIG. 3(o).

Figure 3O:
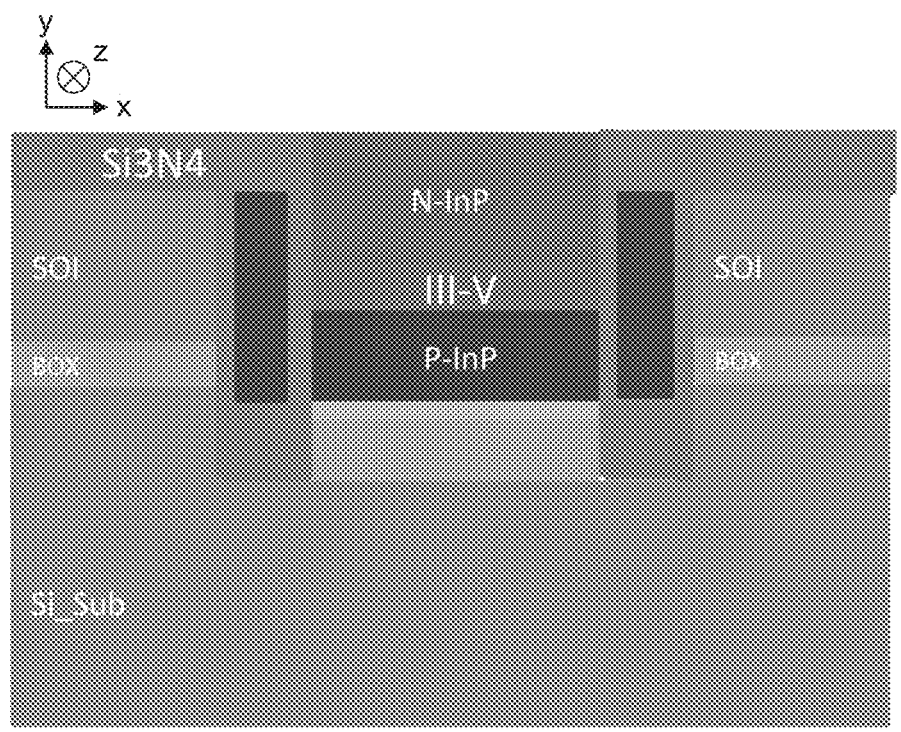

Next, as shown in FIGS. 3(p)(i) and (ii), which are cross-sections taken through the structure of FIG. 3(o) at 90° to that view, a further silicon dioxide layer and silicon nitride layer (in that order) are deposited over the structure. Subsequently, a photoresist is provided across a width of the structure. The photoresist extends in direction 'x' as shown in FIGS. 3(p)(i) and (ii) so as to define a longitudinal direction of the subsequently formed waveguide. The photoresist's width also defines the width of the subsequently formed waveguide.

After the photoresist is provided, an etch is performed to expose a doped layer of the electro-optically active stack as shown in FIG. 3(q)(i). The etch extends partially into the p doped InP layer in this example. The etch depth is not as extensive through the other regions of the structure. The electro-optically active stack can now be considered as including a ridge region (central most) which is taller than adjacent slab regions (located on either side of the ridge region, and in this example formed of the p doped InGaAs and p doped InP layers). As shown in FIG. 3(q)(ii), the etch extends only through the uppermost silicon nitride layer and uppermost silicon dioxide layer. The next silicon nitride layer is not etched. Therefore there is a difference in step through the structure.

After the etch, a further silicon dioxide layer is provided over the now formed waveguide in the electro-optically active stack. A further photo resist is then provided over the electro-optically active stack region only. This is shown in FIGS. 3(r)(i) and (ii), where photoresist is provided over the InP region but not over the SOI regions. After the photoresist has been provided, the silicon dioxide layer above the SOI region is etched as shown in FIG. 3(s)(ii). Notably, the silicon dioxide layer above the electro-optically active stack remains, as shown in FIG. 3(s)(i).

After the etching step discussed above, a further etch is performed to provide a waveguide from in the SOI regions (forming the SOI waveguides), the silicon nitride region, and the α-Silicon region. The result of this etching step is shown in FIGS. 3(t)(i) and (ii). The structure now contains two SOI waveguides, one either side of the electro-optically active waveguide enkindling the electro-optically active stack. The SOI waveguides are connected to the electro-optically active waveguides through a pair of bridge-waveguides, formed of the silicon nitride sidewalls and the α-Silicon fill.

Next the uppermost silicon dioxide layer is removed, and redeposited. The silicon dioxide layer functions as a cladding layer for the waveguide, and may be referred to as an upper cladding layer. An etch is then performed on one lateral side (i.e. in a direction perpendicular to the guiding direction) of the waveguide through the layers of the electro-optically active stack that are contained in the slab portion (i.e. that region which was not etched in the step shown in FIG. 3(q)(i)). The etch extends down to the silicon dioxide layer immediately between the electro-optically active stack and the bed of the cavity. This etch is to provide a clear pad area for the first electrode discussed previously. The result of the etch is shown in FIG. 3(u)(i). With reference to FIG. 3(q)(ii), the newly deposited silicon dioxide layer can be seen on the sidewalls of the SOI waveguide and along an upper surface of the remaining SOI/device layer.

Further silicon dioxide is deposited, to line the pad area etched in the electro-optically active stack. This electrically insulates the subsequently formed electrode from the lower layers of the electro-optically active stack. A further etch is also performed, which extends only partially through the slab portion. This allows a layer in the electro-optically active stack (in this example, the lowermost layer which is the p doped InGaAs layer) to subsequently be connected to the second electrode 105 discussed above. The results of this step are shown in FIGS. 3(v)(i) and (ii).

Next, as shown in FIGS. 3(w)(i) and (ii), silicon dioxide is deposited on the sidewalls of the trench formed by the previous etch. This means the subsequently provided electrode is electrically insulated from the p doped InP layer of the electro-optically active stack. A via is also etched in the uppermost portion of the silicon dioxide cladding layer to expose an uppermost surface of the n doped InP layer (e.g. the uppermost layer of the electro-optically active stack).

In the next, and final, step, a metallization process is performed to provide the first and second electrodes 104 and 105 discussed previously. The first electrode 104 extends from the electrode pad provided on one side of the electro-optically active rib (the portion of the electro-optically active stack not etched previously), up a sidewall of the rib and through the via to contact the uppermost doped layer. The second electrode 105 extends through the etched trench to contact the lowermost doped layer. The results of this step are shown in FIGS. 3(x)(i)-(iii).

Figure 4A:
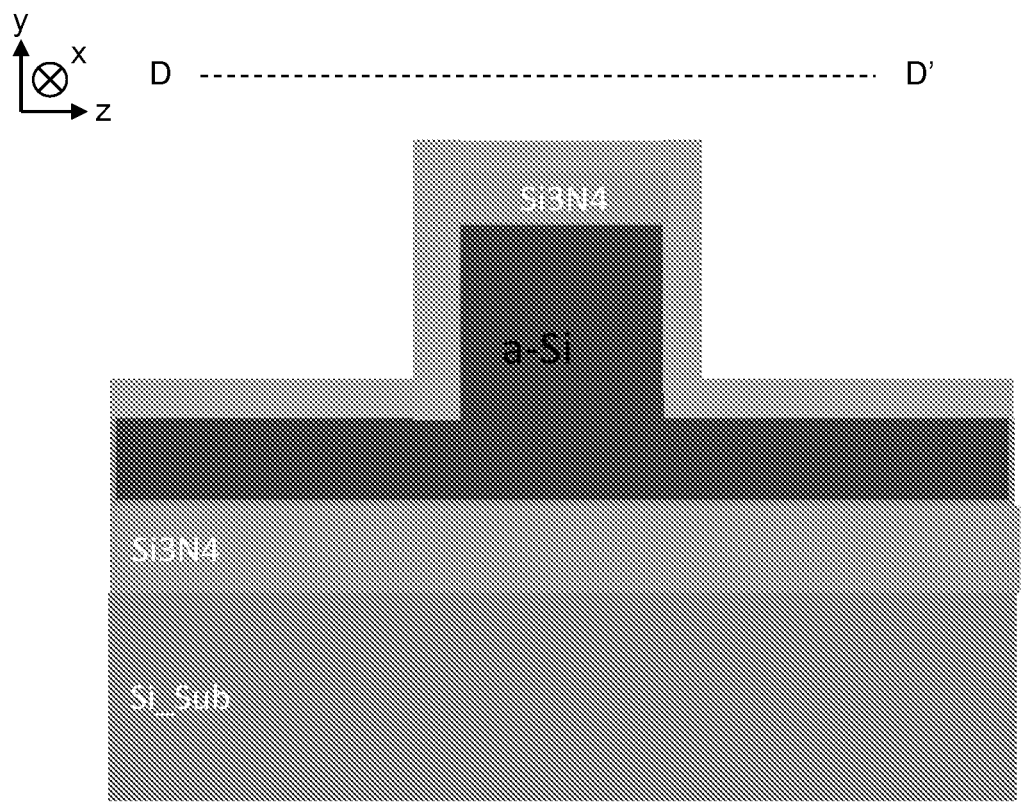
FIGS. 4(a)-4(y) show variant manufacturing stages for an electro-optically active device according to embodiments of the present invention.
Figure 4A:
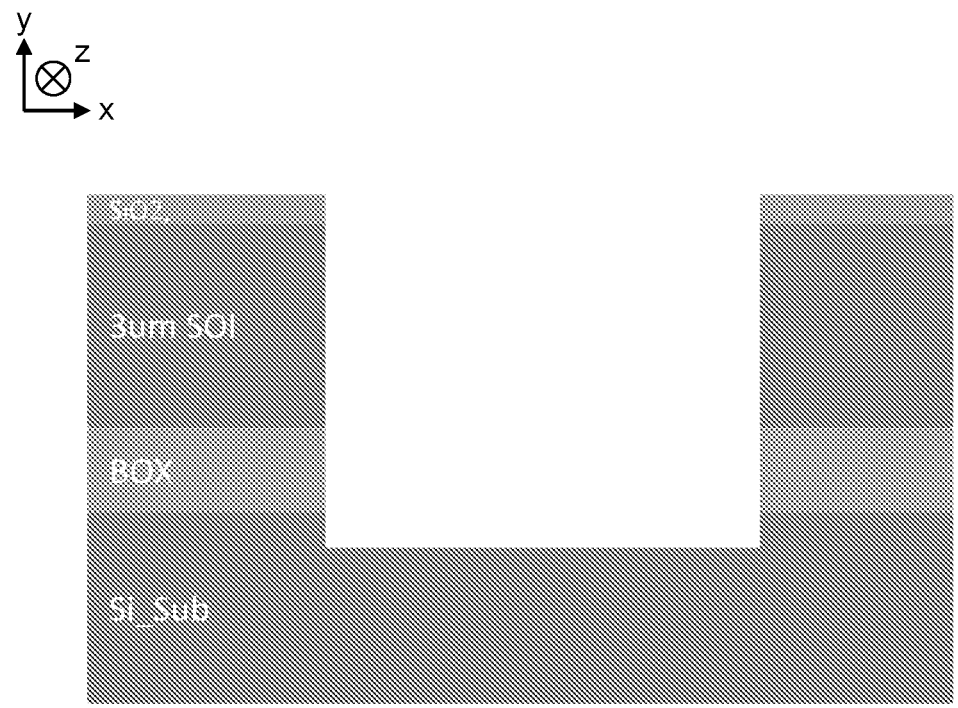
Figure 4B:
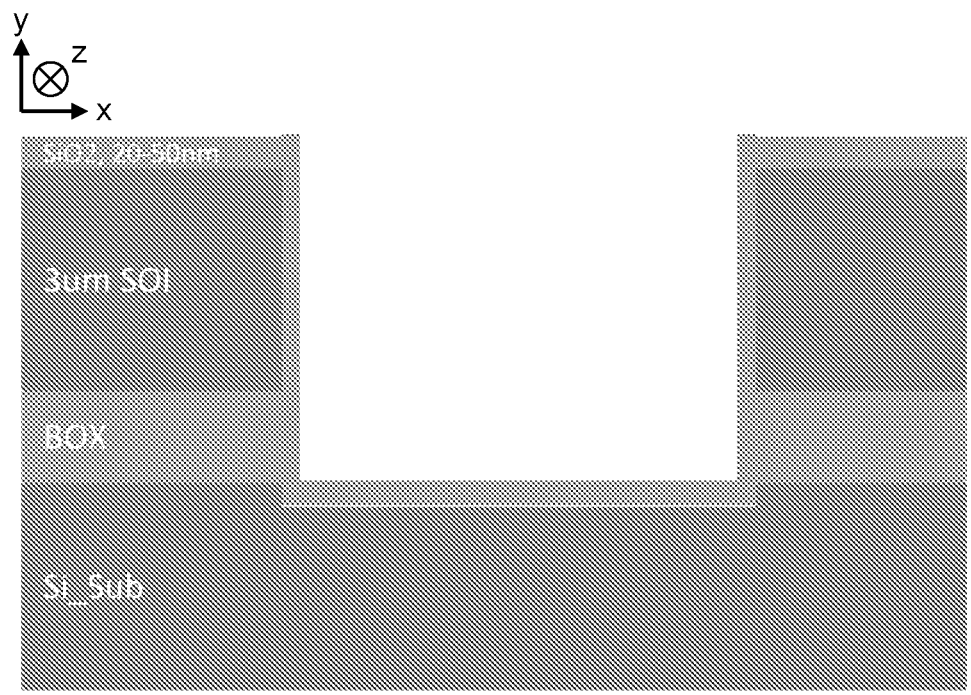
Figure 4C:
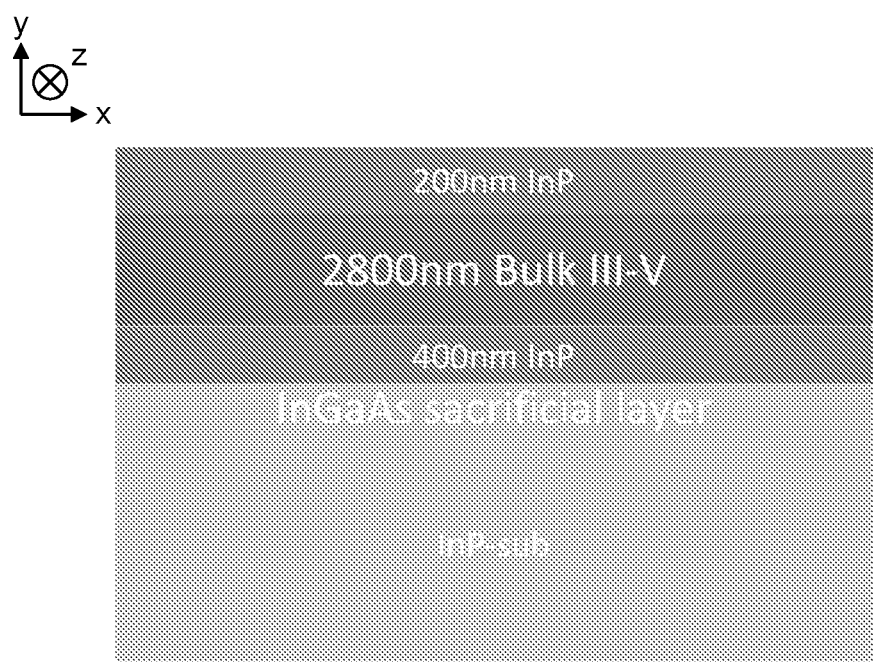
Figure 4D:
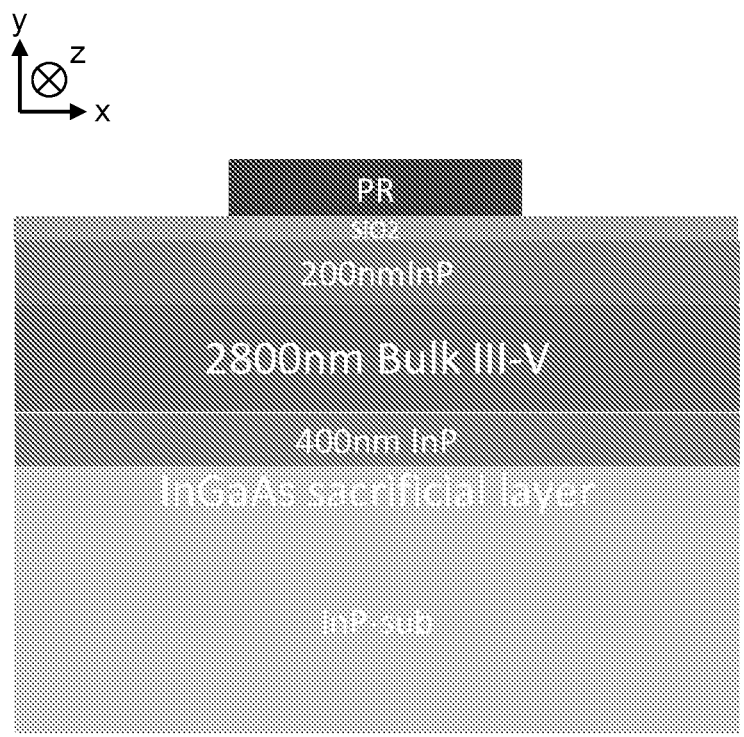
Figure 4E:
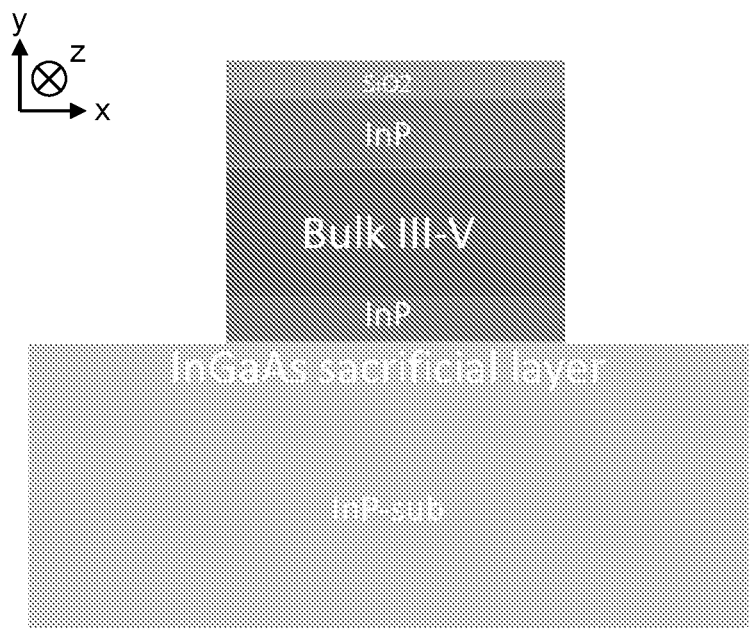
Figure 4F:
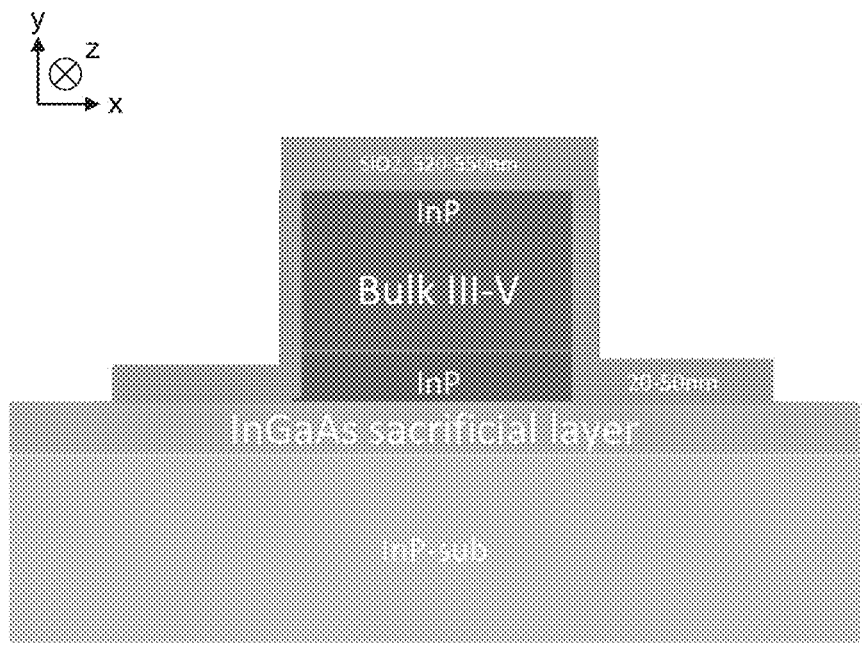
Figure 4G:
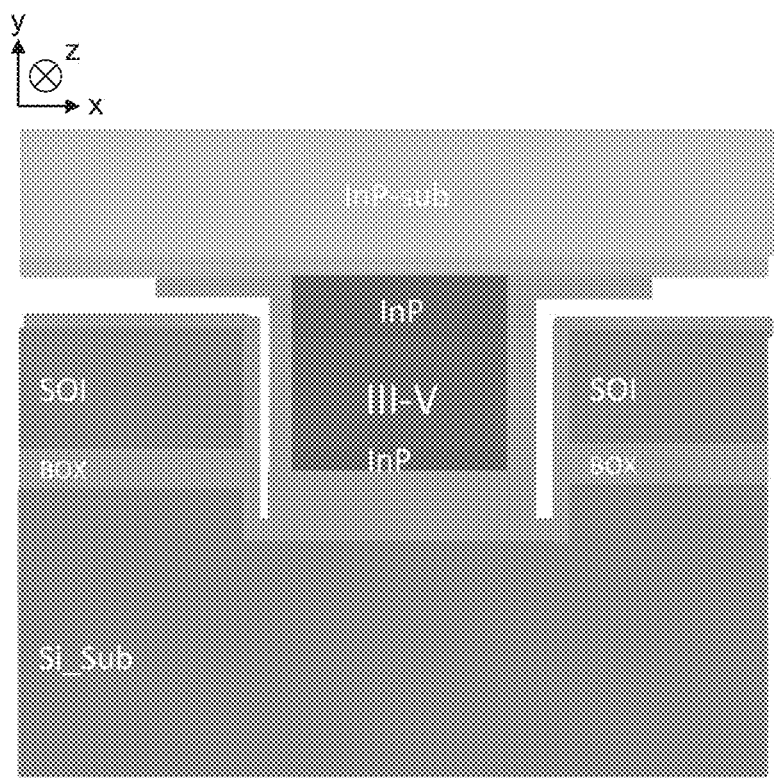
Figure 4H:
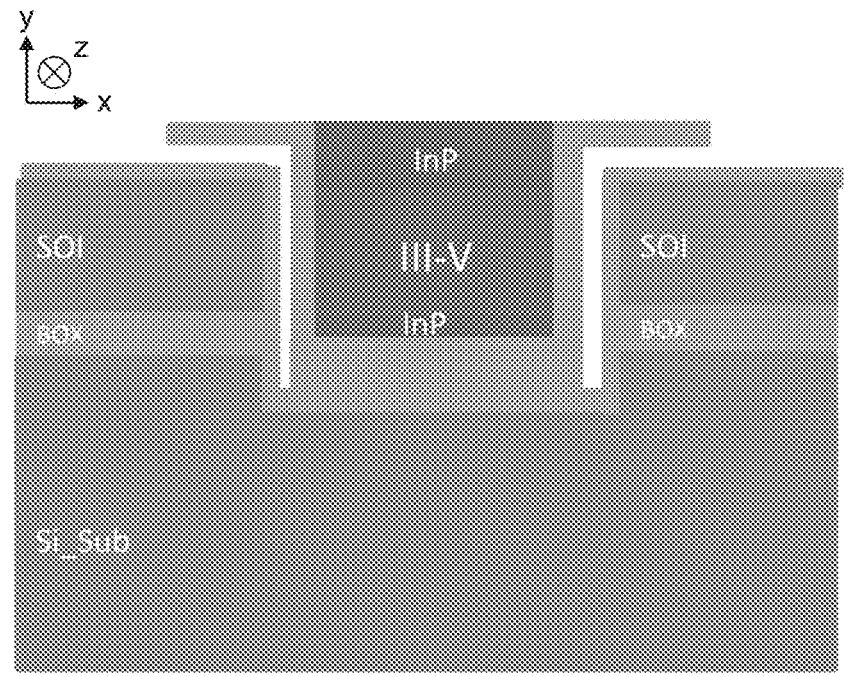
Figure 4I:
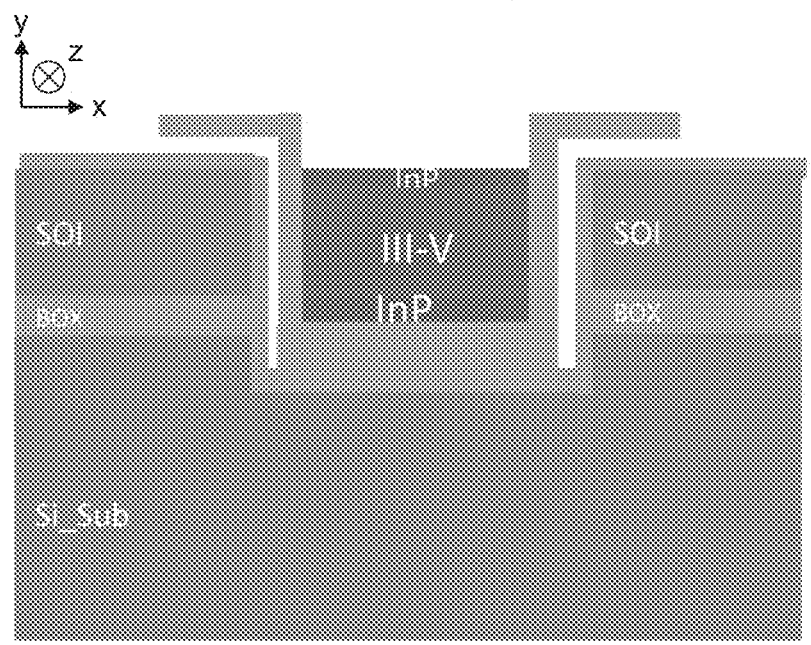
Figure 4J:
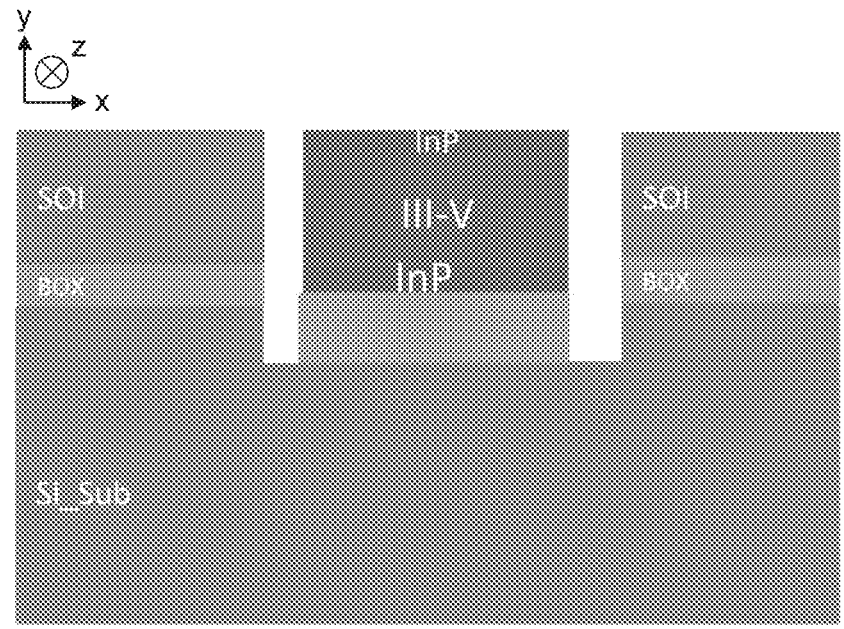
Figure 4K:
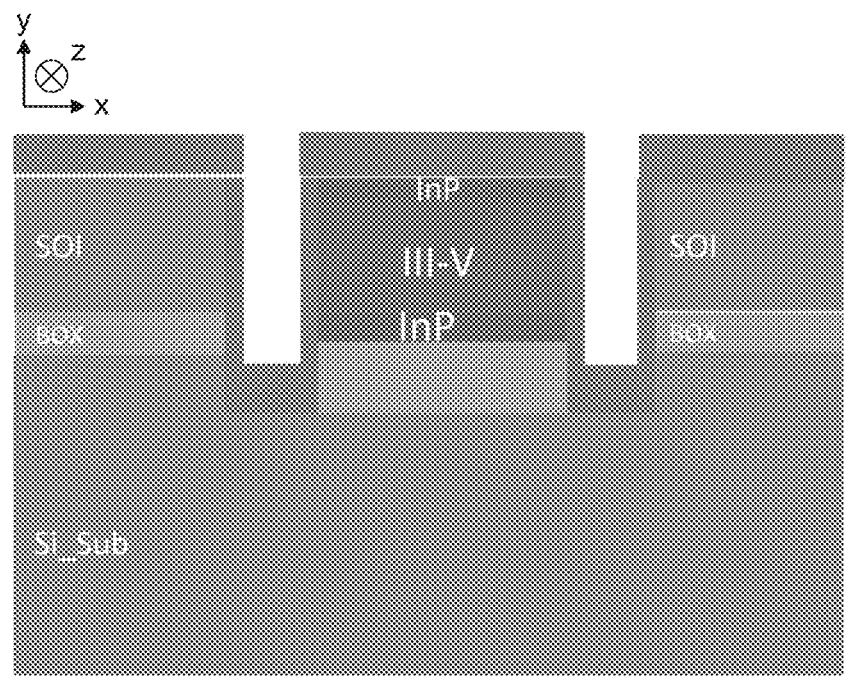
Figure 4L:
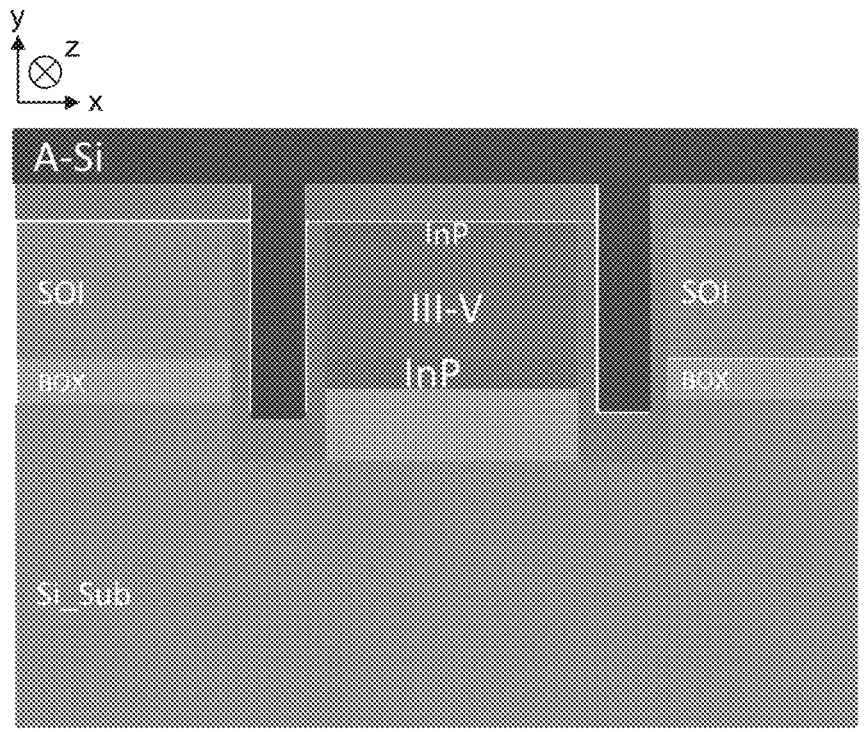
Figure 4M:
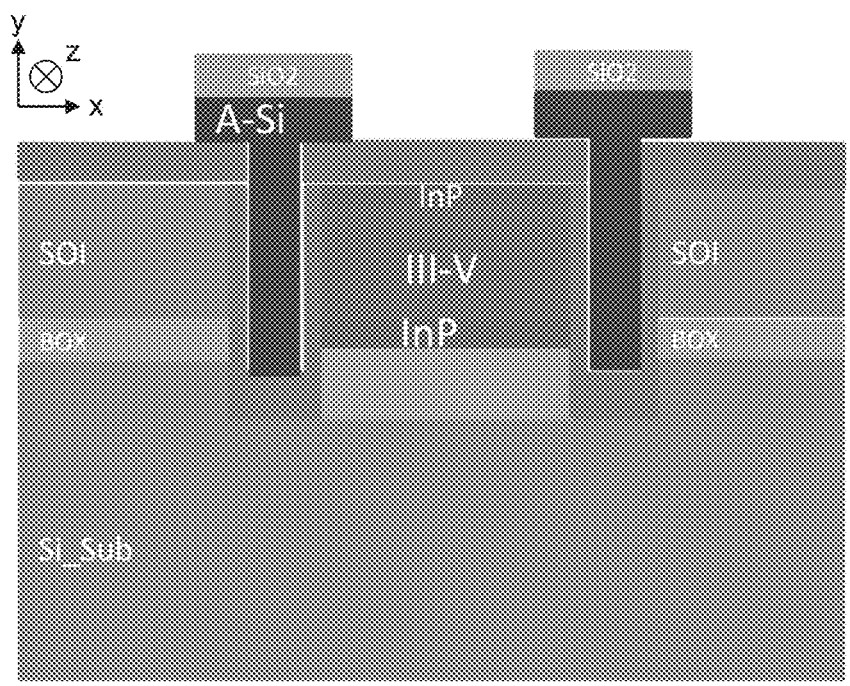
Figure 4N:
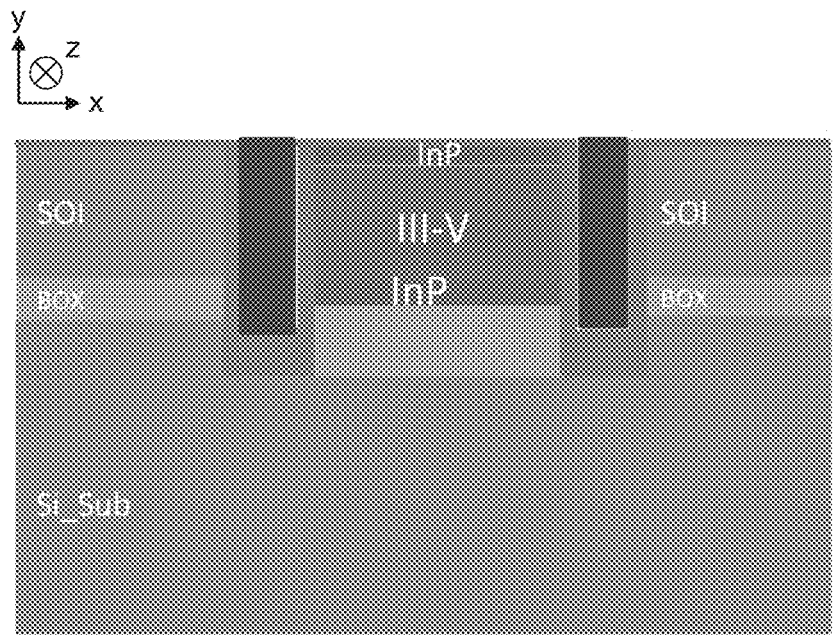
Figure 4O:
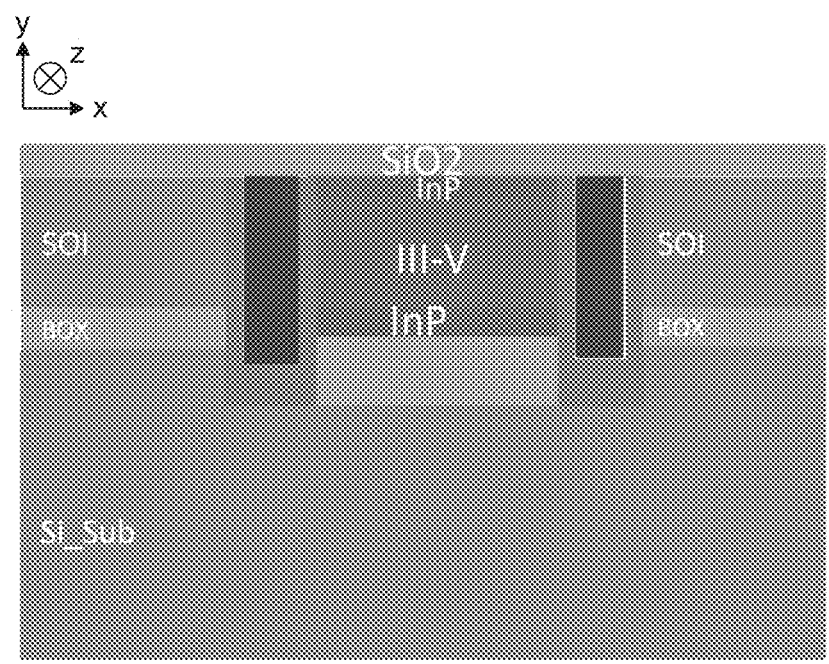
Figure 4R:
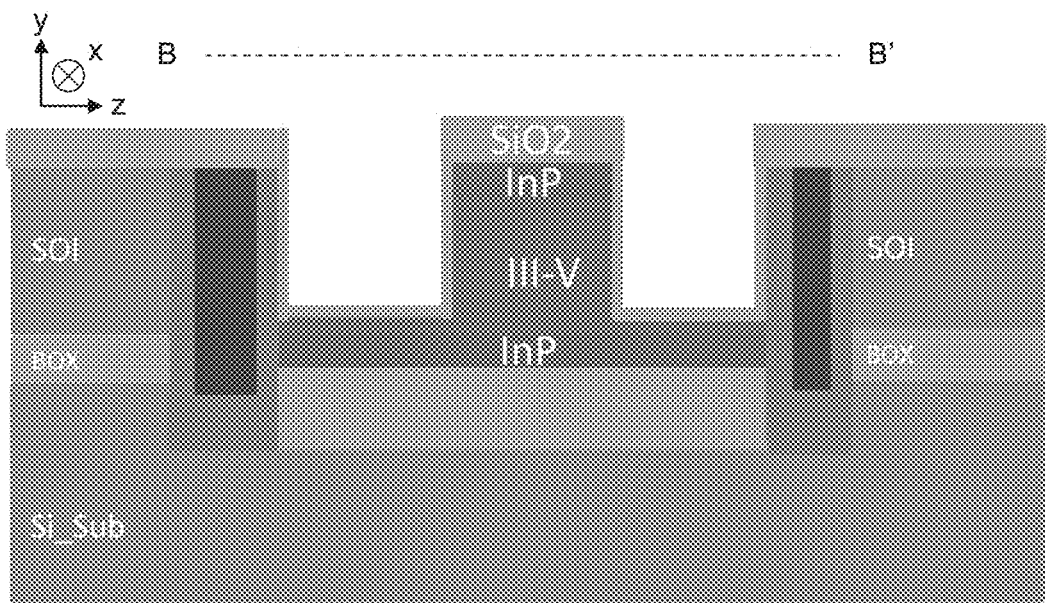
Figure 4S:
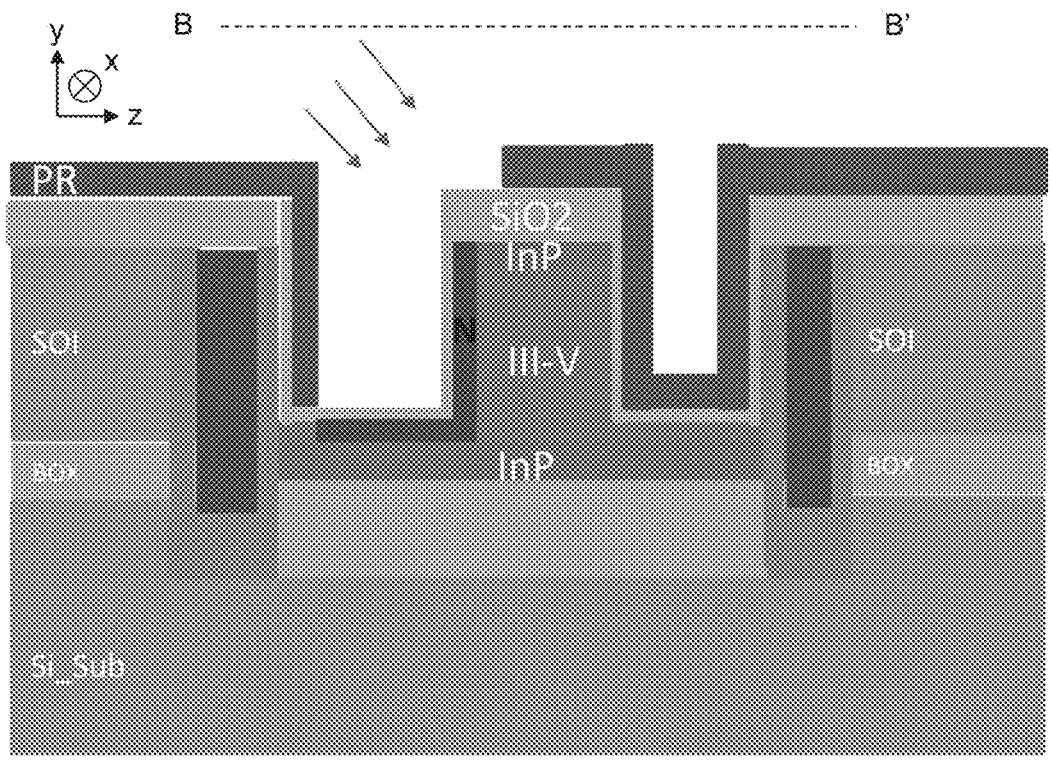
Figure 4T:
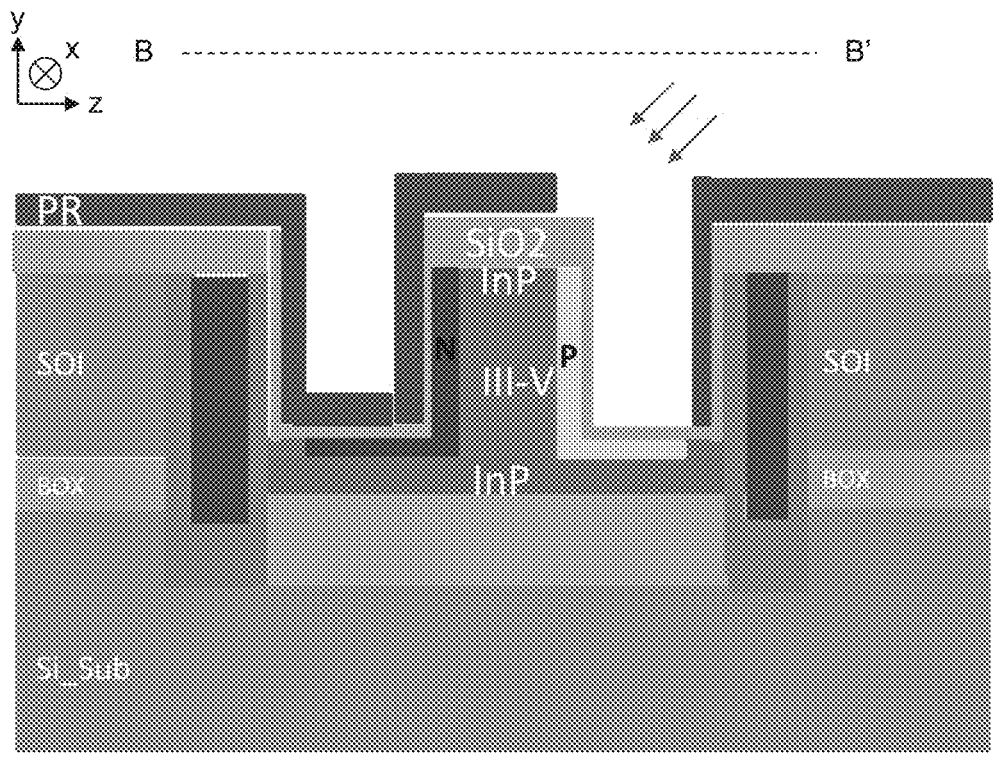
Figure 4U:
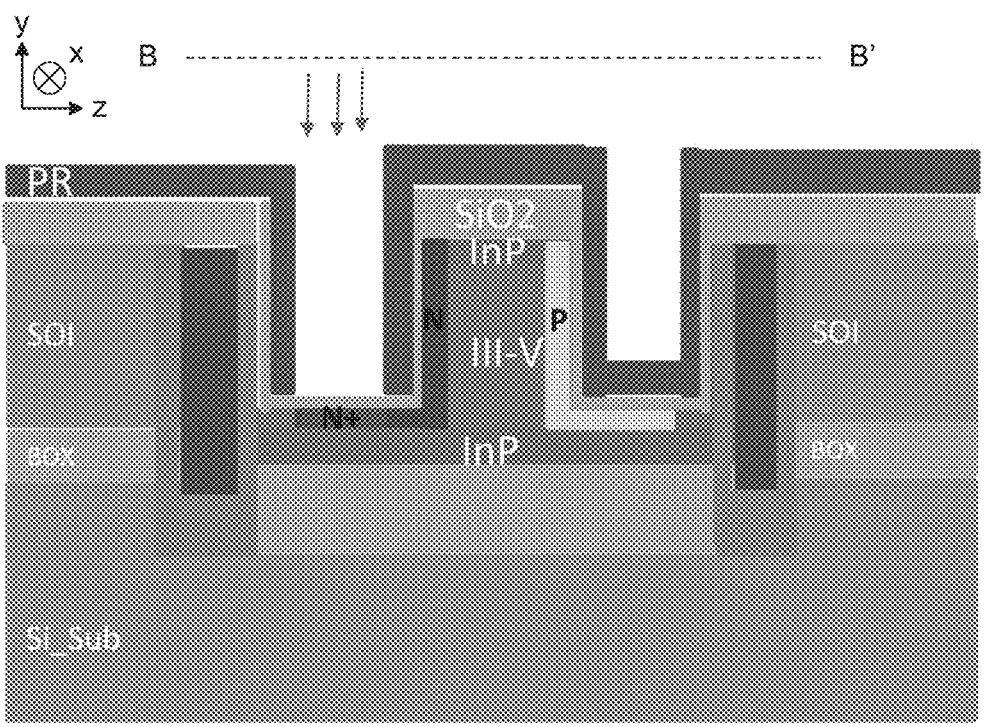
Figure 4V:
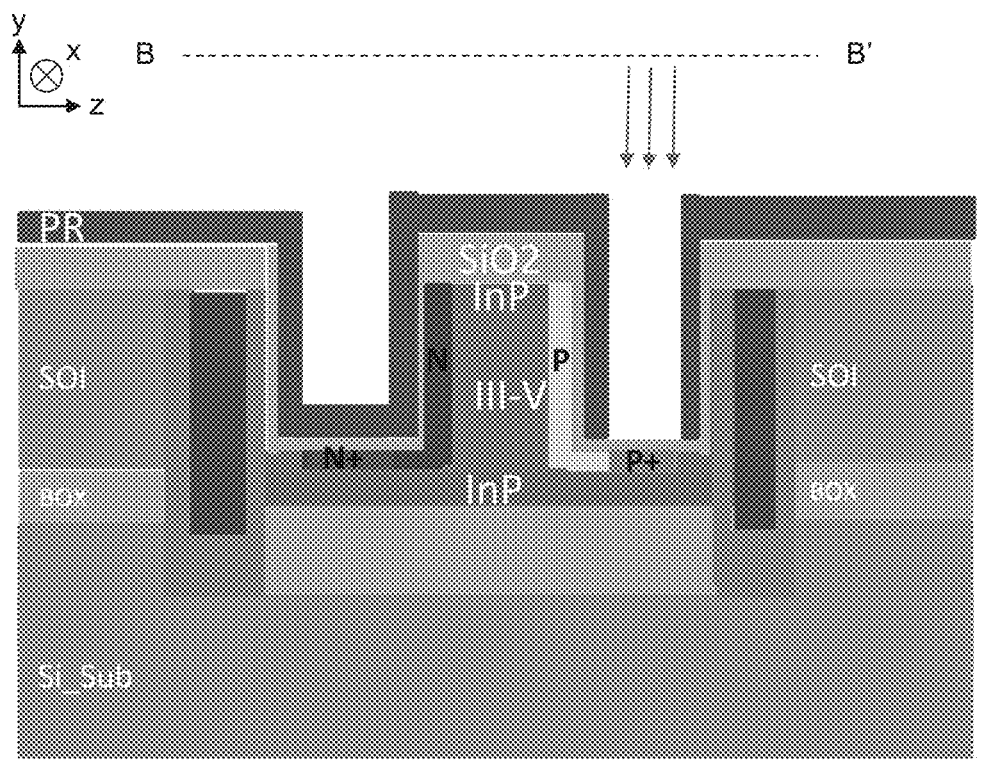
Figure 4W:
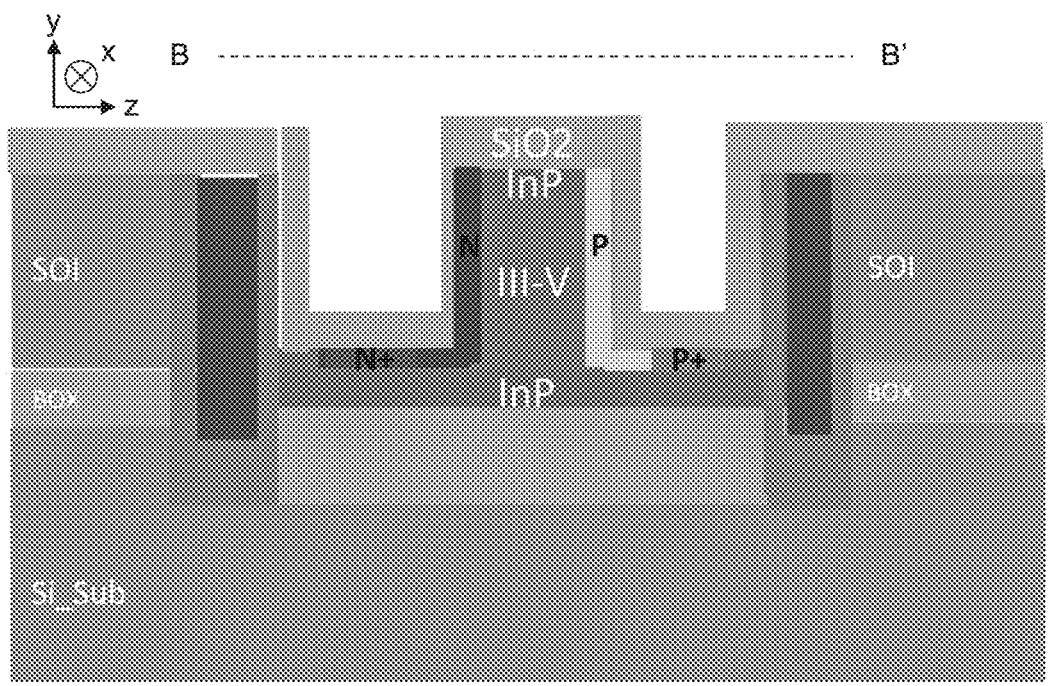
Figure 4X:
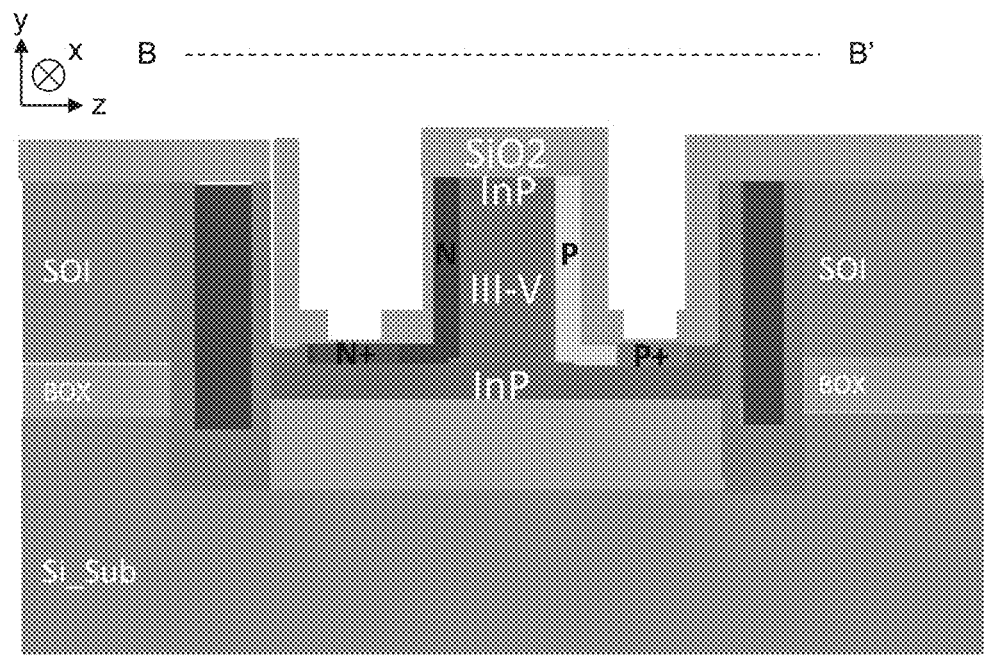
Figure 4Y:
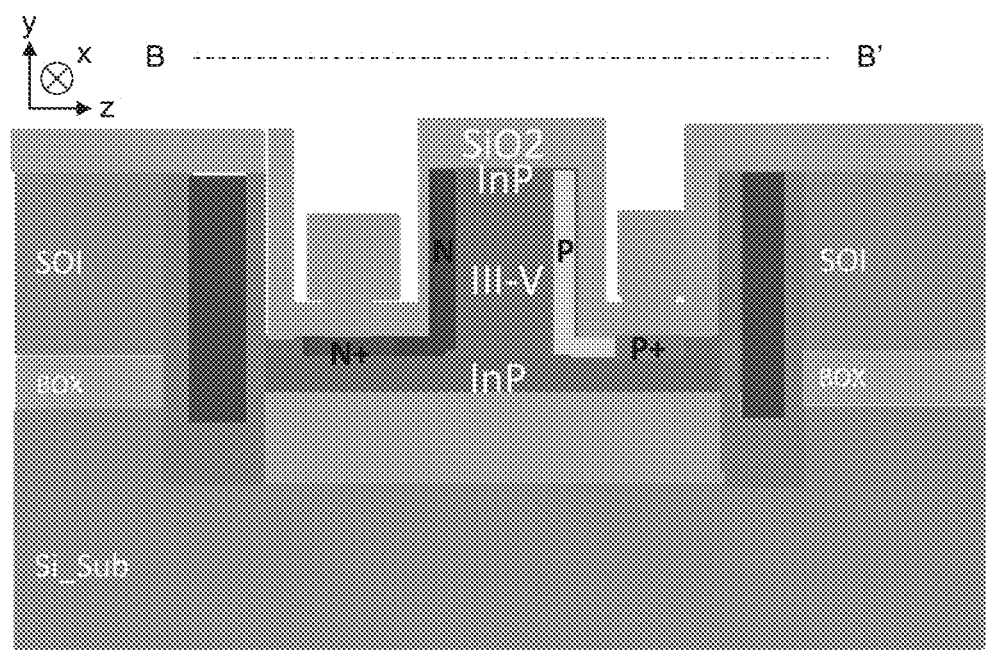

FIGS. 4(a)-4(y) show various manufacturing steps of a variant method according to embodiments of the present invention, and which result in a variant device according to embodiments of the present invention.

In a first step, shown in FIG. 4(a), a cavity is made within an SOI wafer which has across an uppermost surface of the device/SOI layer a silicon dioxide layer. The device layer is 3 μm in thickness (as measured from an uppermost surface of the buried oxide layer to an uppermost surface of the device layer). Next, as shown in FIG. 4(b), a 20-50 nm thick silicon dioxide layer is deposited over all exposed surfaces. This results in a 20-50 nm thick $SiO_2$ layer on the sidewalls and bed of the cavity formed in FIG. 4(a).

Next, in a step performed sequentially, in parallel, or before the preceding steps, a III-V electro-optically active stack is grown (and preferably epitaxially grown) on an indium phosphide substrate. The stack is shown in FIG. 4(c). The electro-optically active stack may have the following composition:

| Layer | R | n/u/p | Material | Thickness (nm) | $E_g$ (nm) | Doping (×$10^{18}$) |
|---|---|---|---|---|---|---|
| 5 | 1 | uid | InP | 200 | 918.407 | — |
| 4 | 1 | uid | InGaAsP(or AlInGaAs) | 2800 | 1260 | — |
| 3 | 1 | uid | InP | 400 | 918.407 | — |
| 2 | 1 | uid | InGaAs | 1000 | 1499.98 | — |
| 1 | | | Substrate: semi-insulating and n doped InP | | | |

Layer 2 may be termed the sacrificial layer.

After the electro-optically active stack has been formed, it is patterned for etching in the manner discussed previously. A photoresist is provided over a portion of the stack as shown in FIG. 4(d). Next, an etch is performed which extends at least to (if not partially through) the InGaAs sacrificial layer at the bottom of the electro-optically active stack. This etch removes any facets, and provides a clean sidewall. This etch also forms the electro-optically active mesa referred to above. The result of the etch is shown in FIG. 4(e).

After the etch has been performed, a silicon dioxide coating is provided over the device and then partially removed as indicated in FIG. 4(f). The silicon dioxide coating is between 520 nm and 550 nm thick on top of the mesa (as a result of adding to the existing silicon dioxide layer), whereas the coating on the sidewalls and on top of the sacrificial layer is between 20 nm and 50 nm thick. The silicon dioxide either side of the mesa is removed, leaving a portion which extends from the mesa along an upper surface of the sacrificial layer.

After the silicon dioxide has been provided and partially removed, a flip-chip bonding process is performed. The electro-optically active mesa is provided within the cavity of the SOI wafer (as shown in FIG. 4(g)). The silicon dioxide layer is then bonded to the bed of the cavity.

After the bonding is complete, a wet etch is performed to remove the sacrificial layer. This allows the indium phosphide substrate to be retrieved and reused in growing subsequent electro-optically active mesas. The result of this wet etch is shown in FIG. 4(h). After the wet etch, a dry etch is performed to remove some of the uppermost (previously lowermost, before flip-chip bonding) layer in the electro-optically active mesa. This etch is performed to bring an uppermost surface of the electro-optically active stack/mesa into alignment with an uppermost surface of the adjacent SOI layers. In this example, the etch is performed until around 200 nm of InP remains as the uppermost layer of the electro-optically active stack. The result of this etch is shown in FIG. 4(i). A further wet etch then removes the silicon dioxide (asides from the silicon dioxide between electro-optically active stack and the bed of the cavity). The result of this further wet etch is shown in FIG. 4(j).

Next, as shown in FIG. 4(k), a silicon rich silicon nitride (e.g. $Si_3N_4$) layer is deposited on all exposed surfaces. This results in the silicon nitride liner discussed previously along the sidewalls of the cavity, the bed of the cavity, and the sidewalls of the electro-optically active stack. Silicon nitride is also present along the uppermost surfaces of the electro-optically active stack and the SOI layers. After the liner has been provided, amorphous or α-Silicon is deposited within the remaining voids of the cavity which may be, in this example, a trench extending around the electro-optically active stack). The amorphous silicon provides a bridge waveguide from each SOI waveguide (when formed, as discussed below) into the electro-optically active stack. The deposition of α-Silicon may be through blanket deposition.

After the α-Silicon has been provided, a mask may be provided over the regions of the α-Silicon fill which are within the cavity (and slightly around the cavity, as shown in FIG. 4(m)). The unmasked regions are then etched, which improves the uniformity of the chemical-mechanical polishing process used subsequently. The etch can also release any wafer stress. The mask is, in this example, silicon dioxide.

After the etching, a chemical-mechanical polishing process is used to provide a uniform upper surface. The result of this is shown in FIG. 4(n). A layer of silicon nitride may be retained (not shown in subsequent figures), having a thickness of between 20 nm and 30 nm. After the CMP process, a silicon dioxide hard mask is provided for use in subsequent waveguide fabrication. This is shown in FIG. 4(*o*).

In a next step, shown in FIGS. 4(*p*)(*i*) and (*ii*) (which are cross-sections taken through the structure of FIG. 4(*o*) at 90° to that view), a photoresist is provided across a width of the structure. The photoresist extends in the direction 'x' as indicated in the figures, so as to define a longitudinal direction of the subsequently formed waveguide. The photoresist's width also defines the width of the subsequently formed waveguide.

After the photoresist has been applied, an etch is performed which extends through the electro-optically active stack to a point at least partially through (if not entirely through) an undoped middle layer of the electro-optically active stack. In the example shown in FIG. 4(*q*)(*i*), the etch extends through the upper silicon dioxide layer, through the upper InP layer, and almost completely through the central III-V layer. A small portion of the III-V layer is retained, either side of the now formed waveguide ridge. The etch also removes, as shown in FIG. 4(*q*)(*ii*) the silicon dioxide layer and a portion of the SOI layer either side of the cavity so as to provide the SOI waveguides discussed previously.

After etching, a further silicon dioxide hard mask is applied, having a thickness of between 20 nm and 50 nm. This is shown in FIG. 4(*r*). After this hard mask is applied, a photoresist is provided over most of the exposed upper surface of the structure. A gap is left, which exposes one side of the waveguide ridge and a portion of the slab immediately adjacent to the exposed ridge. Dopants are then implanted in the exposed sidewall of the ridge and slab, as shown in FIG. 4(*s*). The dopants are implanted at an angle, and are in this example silicon ion dopants. This results in an n doped region which extends up a sidewall of the ridge, as well as along a portion of the slab adjacent to the ridge. The photoresist is then removed.

After the n doped region has been provided, a further photoresist is provided over most of the exposed upper surface of the structure. Again, a gap is left, which exposes an opposite side of the waveguide ridge and an opposite portion of the slab to the sidewall and slab doped previously. Dopants are then implanted in the exposed sidewall of the ridge and slab, as shown in FIG. 4(*t*). The dopants are implanted at an angle, and are in this example, beryllium or zinc ions. This results in a p doped region which extends up a sidewall of the ridge opposite to the n doped region, as well as along a portion of the slab adjacent to the p doped sidewall. The photoresist is then removed.

Next, a photoresist is again applied to the uppermost surface of the structure. A gap is left above a portion of the slab containing n dopants from the previous doping steps. After this photoresist is provided, further dopants are implanted through the gap left in the photoresist. This is shown in FIG. 4(*u*). The result is a portion of the slab which is more heavily doped (n+) than the adjacent portion and the sidewall of the ridge. The dopants may be silicon ions. The photoresist is then removed.

A further photoresist is again applied over the uppermost surface of the structure. A gap is again left, but this time over a portion of the slab containing p dopants from the previous doping steps. After this photoresist is provided, further dopants are implanted through the gap left in the photoresist. This is shown in FIG. 4(*v*). The result is a portion of the slab which is more heavily doped (p+) than the adjacent portion and the sidewall of the ridge. The dopants may be beryllium ions. The photoresist is then removed.

After all doping processes have been performed a silicon dioxide layer is deposited over the upper surface of the structure. The $SiO_2$ layer has a thickness of around 500 nm. After this layer has been deposited, the device is annealed through a rapid thermal anneal process at between 700° C. and 850° C. The structure for annealing is shown in FIG. 4(*w*).

After the device has been annealed, contact vias are opened in the silicon dioxide layer directly above the heavily doped regions. This is shown in FIG. 4(*x*). Subsequently, a metallization process is used to provide first and second electrodes which respectively contact the heavily doped n+ and p+ regions.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A method of manufacturing an electro-optically active device, comprising the steps of:
    etching a cavity on a silicon-on-insulator wafer;
    providing a sacrificial layer adjacent to a substrate of a III-V semiconductor wafer;
    epitaxially growing an electro-optically active structure on the III-V semiconductor wafer;
    etching the epitaxially grown electro-optically active structure into an electro-optically active mesa;
    disposing the electro-optically active mesa in the cavity of the silicon-on-insulator wafer and bonding a surface of the electro-optically active mesa, which is distal to the sacrificial layer, to a bed of the cavity; and
    removing the sacrificial layer between the substrate of the III-V semiconductor wafer and the electro-optically active mesa.

2. The method of claim 1, wherein the sacrificial layer is formed of indium gallium arsenide or silicon dioxide.

3. The method of claim 1, wherein the substrate is formed of indium phosphide or silicon.

4. The method of claim 1, including the step of disposing a bonding layer on at least an uppermost exposed surface of the electro-optically active mesa.

5. The method of claim 4, wherein the bonding layer is formed from silicon dioxide.

6. The method of claim 1, wherein the step of disposing the electro-optically active mesa in the cavity includes a step of inverting the III-V semiconductor wafer, such that the electro-optically active mesa is a lowermost surface of the III-V semiconductor wafer.

7. The method of claim 1, wherein the sacrificial layer is at least 1000 nm thick as measured from an uppermost surface of the substrate to an uppermost surface of the sacrificial layer.

8. The method of claim 1, wherein the electro-optically active mesa is at least partially formed from any one or more of: indium phosphide, aluminium indium gallium arsenide, and indium gallium arsenide.

9. A method of manufacturing an electro-optically active device, comprising the steps of:

providing a III-V semiconductor wafer, the wafer comprising:
- a substrate, a sacrificial layer, and an electro-optically active mesa; wherein the sacrificial layer is between the substrate and the electro-optically active mesa;
- providing a silicon-on-insulator wafer, including a cavity etched therein;
- disposing the electro-optically active mesa in the cavity of the silicon-on-insulator wafer, and bonding a surface of the electro-optically active mesa, which is distal to the sacrificial layer, to a bed of the cavity; and
- removing the sacrificial layer between the substrate of the III-V semiconductor wafer and the electro-optically active mesa.

10. The method of claim 9, wherein the sacrificial layer is formed of indium gallium arsenide.

11. The method of claim 9, wherein the substrate is formed of indium phosphide.

12. The method of claim 9, wherein the electro-optically active mesa includes a bonding layer, located distal to the sacrificial layer.

13. The method of claim 12, wherein the bonding layer is formed from silicon dioxide.

14. The method of claim 9, wherein the step of disposing the electro-optically active mesa in the cavity includes a step of inverting the III-V semiconductor wafer, such that the electro-optically active mesa is a lowermost surface of the III-V semiconductor wafer.

15. The method of claim 9, wherein the sacrificial layer is at least 1000 nm thick as measured from an uppermost surface of the substrate to an uppermost surface of the sacrificial layer.

16. The method of claim 9, wherein the electro-optically active mesa is at least partially formed from any one or more of: indium phosphide, aluminium indium gallium arsenide, and indium gallium arsenide.

17. The method of claim 9, further comprising:
- disposing the sacrificial layer on the substrate;
- epitaxially growing an electro-optically active structure on an opposing side of the sacrificial layer to the substrate; and
- etching the electro-optically active structure to provide the electro-optically active mesa.

18. The method of claim 9, wherein the sacrificial layer is formed of silicon dioxide.

19. The method of claim 9, wherein the substrate is formed of silicon.

20. A silicon based electro-optically active device manufactured by the method of claim 1, the silicon based electro-optically active device comprising:
- a silicon-on-insulator (SOI) waveguide comprising the silicon-on-insulator wafer;
- an electro-optically active waveguide, including the electro-optically active mesa within the cavity of the SOI waveguide; and
- a lined channel between the electro-optically active mesa and the SOI waveguide, the lined channel comprising a liner,
- wherein the lined channel is filled with a filling material to thereby form a bridge-waveguide in the lined channel between the SOI waveguide and the electro-optically active mesa, and there is an insulator layer located between the electro-optically active mesa and the bed of the cavity of the SOI waveguide.

\* \* \* \* \*